(12) United States Patent
Jalili et al.

(10) Patent No.: US 10,877,582 B2
(45) Date of Patent: Dec. 29, 2020

(54) ELECTRONIC DEVICES HAVING BILAYER CAPPING LAYERS AND/OR BARRIER LAYERS

(71) Applicant: H.C. STARCK INC., Newton, MA (US)

(72) Inventors: Helia Jalili, Arlington, MA (US); Francois Dary, Newton, MA (US); Barbara Cox, Norwood, MA (US)

(73) Assignee: H.C. STARCK INC., Newton, MA (US)

( * ) Notice: Subject to any disclaimer, the term of this patent is extended or adjusted under 35 U.S.C. 154(b) by 0 days.

(21) Appl. No.: 16/733,412

(22) Filed: Jan. 3, 2020

(65) Prior Publication Data

US 2020/0218374 A1 Jul. 9, 2020

Related U.S. Application Data

(63) Continuation of application No. 16/512,574, filed on Jul. 16, 2019, now Pat. No. 10,558,284, which is a continuation of application No. 15/873,969, filed on Jan. 18, 2018, now Pat. No. 10,401,994.

(60) Provisional application No. 62/448,137, filed on Jan. 19, 2017, provisional application No. 62/535,403, filed on Jul. 21, 2017.

(51) Int. Cl.
| | |
|---|---|
| G06F 3/041 | (2006.01) |
| G02F 1/1362 | (2006.01) |
| H01L 23/532 | (2006.01) |
| H01L 21/768 | (2006.01) |
| C25D 11/02 | (2006.01) |
| G02F 1/1333 | (2006.01) |
| H01L 27/15 | (2006.01) |

(52) U.S. Cl.
CPC .......... *G06F 3/041* (2013.01); *C25D 11/022* (2013.01); *G02F 1/13338* (2013.01); *G02F 1/136286* (2013.01); *H01L 21/76841* (2013.01); *H01L 23/53223* (2013.01); *H01L 23/53238* (2013.01); *H01L 23/53252* (2013.01); *H01L 23/53266* (2013.01); *H01L 27/156* (2013.01); *G02F 2001/13629* (2013.01); *G02F 2001/136295* (2013.01); *G06F 2203/04103* (2013.01)

(58) Field of Classification Search
CPC ... G06F 3/041–047; G06F 2203/04111; G02F 2001/13629; H01L 21/76841; H01L 23/53238; H01L 23/53223; H01L 23/53252; H01L 23/53266; H01L 23/53228–53238
See application file for complete search history.

(56) References Cited

U.S. PATENT DOCUMENTS

| | | |
|---|---|---|
| 4,133,725 A | 1/1979 | Lerner et al. |
| 10,401,994 B2 | 9/2019 | Jalili et al. |
| 2006/0169592 A1 | 8/2006 | Mardilovich et al. |

(Continued)

FOREIGN PATENT DOCUMENTS

WO 2014197661 12/2014

OTHER PUBLICATIONS

International Search Report, for International Application No. PCT/US2018/014135, dated May 23, 2018, 20 pages.

*Primary Examiner* — Michael Pervan
(74) *Attorney, Agent, or Firm* — Morgan, Lewis & Bockius LLP

(57) ABSTRACT

In various embodiments, electronic devices such as thin-film transistors and/or touch-panel displays incorporate bilayer capping layers and/or barrier layers.

23 Claims, 21 Drawing Sheets

(56) References Cited

U.S. PATENT DOCUMENTS

| | | |
|---|---|---|
| 2008/0093744 A1 | 4/2008 | Wang et al. |
| 2008/0096015 A1 | 4/2008 | Yon |
| 2013/0135224 A1 | 5/2013 | Lee et al. |
| 2014/0362307 A1 | 12/2014 | Sun et al. |
| 2015/0144944 A1 | 5/2015 | Yang et al. |
| 2016/0138179 A1 | 5/2016 | Murakami et al. |
| 2018/0203536 A1 | 7/2018 | Jalili et al. |
| 2018/0204877 A1 | 7/2018 | Jalili et al. |

ELECTRONIC DEVICES HAVING BILAYER CAPPING LAYERS AND/OR BARRIER LAYERS

RELATED APPLICATIONS

This application is a continuation of U.S. patent application Ser. No. 16/512,574, filed Jul. 16, 2019, which is a continuation of U.S. patent application Ser. No. 15/873,969, filed Jan. 18, 2018, which claims the benefit of and priority to U.S. Provisional Patent Application No. 62/448,137, filed Jan. 19, 2017, and U.S. Provisional Patent Application No. 62/535,403, filed Jul. 21, 2017, the entire disclosure of each of which is hereby incorporated herein by reference.

TECHNICAL FIELD

In various embodiments, the present invention relates to the metallization of electronic devices such as flat panel displays and touch panel displays, in particular to capping and barrier layers for such metallization.

BACKGROUND

Flat panel displays have rapidly become ubiquitous in various markets, and are now commonly utilized in a variety of appliances, televisions, computers, cellular phones, and other electronic devices. One example of a commonly used flat panel display is the thin film transistor (TFT) liquid crystal display (LCD), or TFT-LCD. A typical TFT-LCD contains an array of TFTs each controlling the emission of light from a pixel or sub-pixel of an LCD. FIG. 1 depicts the cross-section of a conventional TFT 100 as might be found in a TFT-LCD. As shown, the TFT 100 includes a gate electrode 105 formed on a glass substrate 110. A gate insulator 115 electrically insulates the gate electrode 105 from overlying conductive structures. An active layer 120, typically composed of amorphous silicon, conducts charge between a source electrode 125 and a drain electrode 130, under the electrical control of gate electrode 105, and the conducted charge controls the operation of the pixel or sub-pixel connected thereto (not shown). A source/drain insulator 132 electrically isolates the source electrode 125 from the drain electrode 130 and protectively seals the TFT 100. As shown, each of the gate electrode 105, source electrode 125, and drain electrode 130 typically include a barrier metal layer 135 and a metal conductor layer 140 thereover. The barrier 135 provides good adhesion between the conductor 140 and the underlying glass and/or silicon and reduces or prevents diffusion therebetween. Although it is not shown in FIG. 1, the TFT 100 may also incorporate a capping layer above the conductor 140.

Over time, LCD panel sizes have increased and TFT-based pixel sizes have decreased, placing increasingly high demands on the conductors within the TFT-LCD structure. In order to decrease the resistance in the conductors and thereby increase electrical signal propagation speeds in the TFT-LCD, manufacturers are now utilizing low-resistivity metals such as copper (Cu) for the conductors 140 within the display. However, conventional barriers 135 (and capping layers, if present) may still present issues affecting the performance and processing of TFTs. For example, such layers may not be stable in corrosive (e.g., high-humidity and/or high-temperature) environments.

Similarly, touch-panel displays are becoming more common in electronic devices, and they may even be utilized in tandem with TFT-LCDs. A typical touch-panel display includes an array of sensors arranged in rows and columns and that sense a touch (or close proximity) of, e.g., a finger, via capacitive coupling. FIG. 2A schematically depicts an exemplary sensor array 200 for a touch-panel display that includes multiple conductive column sensors 210 that are interconnected to form columns 220, as well as multiple conductive row sensors 230 that are interconnected to form rows 240. The sensors 210, 230 are formed over a substrate 250 and are electrically coupled to a processor 260 that both senses the changes in capacitive coupling that represent "touches" and provides these signals to other electronic components within a device (e.g., a computer or mobile computing device that incorporates a touch screen). The sensors 210, 230 may be formed of a transparent conductor such as indium tin oxide (ITO), and the substrate 250 may be glass or any other suitably rigid (and/or transparent) support material.

FIG. 2B depicts a magnified perspective view of a point within the sensor array 200 where the interconnected column sensors 210 intersect the interconnected row sensors 230. In order to avoid electrical shorting between the columns 220 and the rows 240 (see FIG. 2A), the interconnections between column sensors 210 are isolated from the underlying or overlying row sensors 230. For example, as shown in FIG. 2B, an insulator layer 270 is disposed between the column 220 of column sensors 210 and a conductive interconnect (or "bridge") 280 that electrically connects the row sensors 230 within a row 240. As shown in FIG. 2C, the interconnects 280 are typically composed of an Al conductive layer 290 with an overlying metallic barrier or capping layer 295. The capping layer 295 helps to prevent diffusion from the conductive layers 290 and protects conductive layers 290 from corrosion during processing and product use. The capping layer 295 may also improve adhesion to overlying layers. Although not shown in FIG. 2C, a barrier layer (e.g., as described above) may also be present below the conductive layer 290. However, as described above for TFT-LCDs, the metals conventionally used for the capping layer 295 (and barrier layers, if present) suffer from one or more deficiencies that limit performance and/or present difficulties in the fabrication process or during operation of the device. For example, the capping layers 295 (and barrier layers) may have high reflectivity and/or be susceptible to changes in physical and/or optical properties upon exposure to corrosive or other aggressive environments. Highly reflective capping layers may be more visible through the touch screen of the final device, deleteriously impacting the visual aesthetics of the device.

In view of the foregoing, there is a need for barrier and/or capping metal layers for electronic devices such as TFT-LCDs and touch-panel displays that provide low reflectivity and that are stable upon exposure to corrosive environments.

SUMMARY

In accordance with various embodiments of the present invention, electronic devices such as TFT-LCDs and touch-panel displays, and the metallic interconnects and electrodes therein, are fabricated utilizing bilayer capping and/or barrier layers that provide low reflectivity and high corrosion resistance. The bilayers include a base layer that includes, consists essentially of, or consists of an alloy of Mo and/or Cu and one or more anodizable metallic elements (e.g., Ta, Nb, Al, Hf, Zr, Ti, and/or Mg) present collectively at weight concentrations of, e.g., 0.5% to 50%, 0.5% to 20%, or even 0.5% to 10%. (Herein, all dopant concentrations are by weight unless otherwise indicated.) In various embodiments, the base layer is anodized to form an overlying dielectric layer that includes, consists essentially, or consists of an oxide and/or nitride of the anodizable metallic element(s). Since Cu and Mo are typically not anodizable, the overlying dielectric layer may be substantially free of Cu and Mo, i.e., may contain Cu and/or Mo in trace (e.g., detectable via chemical analysis) amounts insufficient to affect the properties of the layer, e.g., dielectric constant, corrosion resistance, and/or reflectivity. In various embodiments, a layer being "substantially free of" one or more elements means that the layer contains, by weight, less than 1%, less than 0.8%, less than 0.5%, less than 0.3%, less than 0.2%, less than 0.1%, less than 0.05%, or less than 0.01% of the one or more elements, individually or in combination; one or more (or even all) of the elements may be present in the layer at a finite, non-zero concentration, e.g., more than 0.001%, more than 0.005%, more than 0.01%, more than 0.05%, more than 0.1%, or more than 0.5%. In addition, an interfacial region of the base layer (i.e., the portion of the base layer directly underlying and in contact with the dielectric layer) may be depleted in, or may even be substantially free of, the anodizable metallic element(s), which may be preferentially "consumed" in the anodizing process.

Advantageously, the resulting bilayers have lower reflectivity and improved corrosion resistance compared to the base layer without the overlying anodized dielectric layer. In addition, the anodizing process may be performed at room temperature (e.g., approximately 25° C. and/or with no applied heat) and forms the dielectric layers quite quickly. Moreover, in various embodiments the anodizing process is performed as a wet chemical process, and thus requires no elevated and/or complicated heat treatments; advantageously, this prevents phase segregation or contamination that may accompany processes such as heat treatments or reactive sputtering techniques.

In various embodiments, the composition of the base layer may be engineered to self-limit the anodizing process. For example, the concentration of the anodizable metallic element(s) within the base layer may decrease (e.g., gradually or abruptly) as a function of thickness away from the top surface of the base layer, and may even diminish to approximately 0% within the thickness of the base layer. The anodizing process may proceed until substantially all of the anodizable metallic element(s) have been consumed, at which point the process stops due to the anodization resistance of Cu and Mo. For example, the base layer may be fabricated via a process such as sputtering, in which the primary element(s) of the layer are co-deposited with the anodizable metallic element(s). As the layer is deposited, the relative concentration (or presence) of one or more of the anodizable metallic elements may be varied within the thickness of the base layer.

In other embodiments, the anodizing process may be self-limiting as a result of the insulating layer formed on the base layer inhibiting current flow within the layer structure and thereby preventing further layer growth. Thus, the thickness and/or reflectivity of the anodized layer may be selected, in various embodiments, via selection of applied voltage, assuming that the concentration of anodizable elements within the base layer is not prematurely depleted and/or that the anodized layer itself is sufficiently free of porosity. In various embodiments, anodization times range from approximately 10 seconds to approximately 5 minutes, approximately 10 seconds to approximately 2 minutes, approximately 10 seconds to approximately 1 minute, approximately 10 seconds to approximately 50 seconds, or approximately 10 seconds to approximately 30 seconds. In various embodiments, the base layer may be anodized for a time period longer than these times, even in the substantial absence of further layer growth after formation of the anodized layer (and some growth thereof).

In an exemplary implementation, bilayer barriers are formed directly on substrate layers such as glass and/or silicon-based layers, and conductor layers including or consisting essentially of highly conductive metals such as Cu, silver (Ag), aluminum (Al), or gold (Au) (or alloys thereof or alloys containing one or more of these and one or more other elements) are formed thereover to form the various electrodes in a TFT structure. In another exemplary implementation, highly conductive metals such as Cu, Ag, Al, and/or Au (or alloys thereof or alloys containing one or more of these and one or more other elements) are utilized as conductive interconnects in a touch-panel display and are capped with bilayer capping layers. In various embodiments, TFT electrodes may also or instead incorporate bilayer capping layers, and touch-panel interconnects may also or instead incorporate bilayer barrier layers.

In various embodiments, the thickness of the bilayer barrier and capping layers is, for example, between approximately 15 nm and approximately 100 nm. The thickness of the overlying anodized dielectric layer may be selected to obtain one or more optical properties of the layer (e.g., refractive index, extinction coefficient, etc.) for a desired application. In various embodiments, the thickness of the anodized dielectric layer (which may include, consist essentially of, or consist of an oxide, e.g., an oxide of one or more of the anodizable elements in the barrier or capping layer) ranges from approximately 1 nm to approximately 20 nm, approximately 1 nm to approximately 15 nm, approximately 1 nm to approximately 10 nm, or approximately 1 nm to approximately 8 nm.

As mentioned above, the bilayer barrier and capping layers protect the underlying baser layers from corrosion that may occur in, for example, high-humidity and/or high-temperature environments, despite the relatively thin thickness of the anodized dielectric layer. For example, anodized bilayer barrier layers and capping layers may be exposed to environments having up to at least approximately 90% humidity and/or at least 90° C. temperatures without deleterious impact on the resistivity or reflectivity of the layer. The thin thickness of the anodized layer also presents another advantage, namely that the etch rate of the base layer is substantially unaffected by the presence of the dielectric layer, facilitating processing and fabrication of microelectronic devices without substantial (if any) changes to etch chemistries and processes.

In various embodiments, bilayer barrier layers are formed on substrate layers such as glass and/or silicon-based layers to form, with conductive interconnects thereover, the various electrodes in a TFT structure or to form the metallization in a touch-panel display. The base layers of the bilayer capping and/or barrier layers in accordance with embodiments of the invention may be formed by, e.g., physical vapor deposition techniques such as sputtering from sputtering targets that include, consist essentially of, or consist of the alloy desired for a particular application. As mentioned above, such base layers may be anodized to form the overlying dielectric layer and thus the final bilayer structure. In various embodiments, multiple different sputtering targets, each containing one or more of the elements of the desired base layer, may be utilized for deposition of the layer.

In an aspect, embodiments of the invention feature a thin-film transistor, or another electronic device, that includes, consists essentially of, or consists of a substrate and an electrode. The electrode includes, consists essentially of, or consists of a bilayer barrier layer and a conductor layer disposed over the barrier layer. The conductor layer may be disposed in direct mechanical contact with the barrier layer. The conductor layer includes, consists essentially of, or consists of Cu, Ag, Al, and/or Au. The conductor layer may include, consist essentially of, or consist of Cu, Ag, and/or Au. The bilayer barrier layer includes, consists essentially of, or consists of a base layer and a dielectric layer disposed thereover. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The dielectric layer includes, consists essentially of, or consists of an oxide, nitride, or oxynitride of one or more (or even all) of the one or more anodizable alloying elements.

Embodiments of the invention may include one or more of the following in any of a variety of combinations. The substrate may include, consist essentially of, or consist of glass and/or silicon. The substrate may include, consist essentially of, or consist of amorphous silicon. The base layer may include, consist essentially of, or consist of an alloy or mixture of (i) Mo and Nb, (ii) Mo, Ta, and Nb, (iii) Mo, Nb, and Ti, (iv) Mo and Ti, or (v) Mo, Nb, and Zr. The base layer may include, consist essentially of, or consist of an alloy or mixture of Cu, Ta, and Zr. The dielectric layer may be substantially free of Cu and/or Mo. The base layer may include, consist essentially of, or consist of an interfacial portion disposed beneath the dielectric layer and a bottom portion disposed beneath the interfacial portion. The interfacial portion may be in contact with the dielectric layer. The bottom portion may be in contact with the interfacial portion. A concentration of at least one (or even all) of the one or more anodizable alloying elements within the interfacial portion may be less than a concentration of at least one (or even all) of the one or more anodizable alloying elements within the bottom portion. The interfacial portion may be substantially free of at least one (or even all) of the one or more anodizable alloying elements. The bottom portion may be substantially free of at least one (or even all) of the one or more anodizable alloying elements. The electrode may include a bilayer capping layer disposed over the conductor layer. The capping layer may be disposed in contact with the conductor layer. The bilayer capping layer may include, consist essentially of, or consist of a second base layer and a second dielectric layer disposed thereover. The second base layer may include, consist essentially of, or consist of an alloy of Cu and/or Mo with one or more second anodizable alloying elements selected from the list consisting of Ta, Nb, Al, Hf, Zr, Ti, and Mg. The one or more second anodizable alloying elements may be present individually or in combination at a concentration of 0.5 weight %-50 weight %. The second dielectric layer may include, consist essentially of, or consist of an oxide, nitride, or oxynitride of one or more (or even all) of the one or more second anodizable alloying elements. The base layer may include, consist essentially of, or consist of an alloy the same as that of the second base layer. The base layer may include, consist essentially of, or consist of an alloy different from that of the second base layer.

In another aspect, embodiments of the invention feature a thin-film transistor, or other electronic device, that includes, consists essentially of, or consists of a substrate and an electrode. The electrode includes, consists essentially of, or consists of a conductor layer and a bilayer capping layer disposed over the conductor layer. The capping layer may be disposed in direct mechanical contact with the conductor layer. The conductor layer includes, consists essentially of, or consists of Cu, Ag, Al, and/or Au. The conductor layer may include, consist essentially of, or consist of Cu, Ag, and/or Au. The bilayer capping layer includes, consists essentially of, or consists of a base layer and a dielectric layer disposed thereover. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The dielectric layer includes, consists essentially of, or consists of an oxide, nitride, or oxynitride of one or more (or even all) of the one or more anodizable alloying elements.

Embodiments of the invention may include one or more of the following in any of a variety of combinations. The substrate may include, consist essentially of, or consist of glass and/or silicon. The substrate may include, consist essentially of, or consist of amorphous silicon. The base layer may include, consist essentially of, or consist of an alloy or mixture of (i) Mo and Nb, (ii) Mo, Ta, and Nb, (iii) Mo, Nb, and Ti, (iv) Mo and Ti, or (v) Mo, Nb, and Zr. The base layer may include, consist essentially of, or consist of an alloy or mixture of Cu, Ta, and Zr. The dielectric layer may be substantially free of Cu and/or Mo. The base layer may include, consist essentially of, or consist of an interfacial portion disposed beneath the dielectric layer and a bottom portion disposed beneath the interfacial portion. The interfacial portion may be in contact with the dielectric layer. The bottom portion may be in contact with the interfacial portion. A concentration of at least one (or even all) of the one or more anodizable alloying elements within the interfacial portion may be less than a concentration of at least one (or even all) of the one or more anodizable alloying elements within the bottom portion. The interfacial portion may be substantially free of at least one (or even all) of the one or more anodizable alloying elements. The bottom portion may be substantially free of at least one (or even all) of the one or more anodizable alloying elements.

In yet another aspect, embodiments of the invention feature a touch-panel display, or other electronic device, that includes, consists essentially of, or consists of a substrate and an interconnect disposed thereover. The interconnect comprises, consists essentially of, or consists of a conductor layer and a bilayer capping layer disposed over the conductor layer. The capping layer may be disposed in direct mechanical contact with the conductor layer. The conductor layer includes, consists essentially of, or consists of Cu, Ag, Al, and/or Au. The conductor layer may include, consist essentially of, or consist of Cu, Ag, and/or Au. The bilayer capping layer includes, consists essentially of, or consists of a base layer and a dielectric layer disposed thereover. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The dielectric layer includes, consists essentially of, or consists of an oxide, nitride, or oxynitride of one or more (or even all) of the one or more anodizable alloying elements.

Embodiments of the invention may include one or more of the following in any of a variety of combinations. The electronic device may include a plurality of conductive touch-panel row sensors (i) arranged in lines extending along a first direction and (ii) disposed over the substrate. The electronic device may include a plurality of conductive touch-panel column sensors (i) arranged in lines extending along a second direction and intersecting the lines of the row sensors and (ii) disposed over the substrate. The interconnect may be disposed at a point of intersection between a line of row sensors and a line of column sensors. The interconnect may electrically connect two column sensors or two row sensors. The interconnect may extend over or under a row sensor and electrically connect two column sensors. The electronic device may include an insulating layer disposed between the interconnect and the row sensor and electrically insulating the interconnect and the row sensor. The interconnect may extend over or under a column sensor and electrically connect two row sensors. The electronic device may include an insulating layer disposed between the interconnect and the column sensor and electrically insulating the interconnect and the column sensor. One or more of the row sensors and/or one or more of the column sensors may include, consist essentially of, or consist of a substantially transparent conductive material, e.g., indium tin oxide.

The substrate may include, consist essentially of, or consist of an insulating material. The substrate may include, consist essentially of, or consist of glass. The substrate may include, consist essentially of, or consist of glass and/or silicon. The substrate may include, consist essentially of, or consist of amorphous silicon. The base layer may include, consist essentially of, or consist of an alloy or mixture of (i) Mo and Nb, (ii) Mo, Ta, and Nb, (iii) Mo, Nb, and Ti, (iv) Mo and Ti, or (v) Mo, Nb, and Zr. The base layer may include, consist essentially of, or consist of an alloy or mixture of Cu, Ta, and Zr. The dielectric layer may be substantially free of Cu and/or Mo. The base layer may include, consist essentially of, or consist of an interfacial portion disposed beneath the dielectric layer and a bottom portion disposed beneath the interfacial portion. The interfacial portion may be in contact with the dielectric layer. The bottom portion may be in contact with the interfacial portion. A concentration of at least one (or even all) of the one or more anodizable alloying elements within the interfacial portion may be less than a concentration of at least one (or even all) of the one or more anodizable alloying elements within the bottom portion. The interfacial portion may be substantially free of at least one (or even all) of the one or more anodizable alloying elements. The bottom portion may be substantially free of at least one (or even all) of the one or more anodizable alloying elements.

The interconnect may include a bilayer barrier layer disposed beneath the conductor layer. The barrier layer may be disposed in contact with the conductor layer. The bilayer barrier layer may include, consist essentially of, or consist of a second base layer and a second dielectric layer disposed thereover. The second base layer may include, consist essentially of, or consist of an alloy of Cu and/or Mo with one or more second anodizable alloying elements selected from the list consisting of Ta, Nb, Al, Hf, Zr, Ti, and Mg. The one or more second anodizable alloying elements may be present individually or in combination at a concentration of 0.5 weight %-50 weight %. The second dielectric layer may include, consist essentially of, or consist of an oxide, nitride, or oxynitride of one or more (or even all) of the one or more second anodizable alloying elements. The base layer may include, consist essentially of, or consist of an alloy the same as that of the second base layer. The base layer may include, consist essentially of, or consist of an alloy different from that of the second base layer.

In another aspect, embodiments of the invention feature a touch-panel display, or another electronic device, that includes, consists essentially of, or consists of a substrate and an interconnect disposed thereover. The interconnect comprises, consists essentially of, or consists of a conductor layer and a bilayer barrier layer disposed beneath the conductor layer. The barrier layer may be disposed in direct mechanical contact with the conductor layer. The conductor layer includes, consists essentially of, or consists of Cu, Ag, Al, and/or Au. The conductor layer may include, consist essentially of, or consist of Cu, Ag, and/or Au. The bilayer barrier layer includes, consists essentially of, or consists of a base layer and a dielectric layer disposed thereover. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The dielectric layer includes, consists essentially of, or consists of an oxide, nitride, or oxynitride of one or more (or even all) of the one or more anodizable alloying elements.

Embodiments of the invention may include one or more of the following in any of a variety of combinations. The electronic device may include a plurality of conductive touch-panel row sensors (i) arranged in lines extending along a first direction and (ii) disposed over the substrate. The electronic device may include a plurality of conductive touch-panel column sensors (i) arranged in lines extending along a second direction and intersecting the lines of the row sensors and (ii) disposed over the substrate. The interconnect may be disposed at a point of intersection between a line of row sensors and a line of column sensors. The interconnect may electrically connect two column sensors or two row sensors. The interconnect may extend over or under a row sensor and electrically connect two column sensors. The electronic device may include an insulating layer disposed between the interconnect and the row sensor and electrically insulating the interconnect and the row sensor. The interconnect may extend over or under a column sensor and electrically connect two row sensors. The electronic device may include an insulating layer disposed between the interconnect and the column sensor and electrically insulating the interconnect and the column sensor. One or more of the row sensors and/or one or more of the column sensors may include, consist essentially of, or consist of a substantially transparent conductive material, e.g., indium tin oxide.

The substrate may include, consist essentially of, or consist of an insulating material. The substrate may include, consist essentially of, or consist of glass. The substrate may include, consist essentially of, or consist of glass and/or silicon. The substrate may include, consist essentially of, or consist of amorphous silicon. The base layer may include, consist essentially of, or consist of an alloy or mixture of (i) Mo and Nb, (ii) Mo, Ta, and Nb, (iii) Mo, Nb, and Ti, (iv) Mo and Ti, or (v) Mo, Nb, and Zr. The base layer may include, consist essentially of, or consist of an alloy or mixture of Cu, Ta, and Zr. The dielectric layer may be substantially free of Cu and/or Mo. The base layer may include, consist essentially of, or consist of an interfacial portion disposed beneath the dielectric layer and a bottom portion disposed beneath the interfacial portion. The interfacial portion may be in contact with the dielectric layer. The bottom portion may be in contact with the interfacial portion. A concentration of at least one (or even all) of the one or more anodizable alloying elements within the interfacial portion may be less than a concentration of at least one (or even all) of the one or more anodizable alloying elements within the bottom portion. The interfacial portion may be substantially free of at least one (or even all) of the one or more anodizable alloying elements. The bottom portion may be substantially free of at least one (or even all) of the one or more anodizable alloying elements.

In yet another aspect, embodiments of the invention feature a method of forming a microelectronic device. A substrate may be provided. A base layer is deposited over the substrate. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The base layer is anodized to form a bilayer barrier layer. The bilayer barrier layer includes, consists essentially of, or consists of (i) a dielectric layer and (ii) a remaining portion of the base layer disposed beneath the dielectric layer. A conductor layer is deposited over the barrier layer.

Embodiments of the invention may include one or more of the following in any of a variety of combinations. The dielectric layer may include, consist essentially of, or consist of an oxide, nitride, or oxynitride of one or more (or even all) of the one or more anodizable alloying elements. Anodizing the base layer may include, consist essentially of, or consist of immersing at least a portion of the base layer in an electrolyte and applying a voltage to the base layer (e.g., between the base layer and an electrode (e.g., a cathode)). The electrolyte may include, consist essentially of, or consist of an acidic solution. The electrolyte may include, consist essentially of, or consist of sulfuric acid, nitric acid, chromic acid, and/or phosphoric acid. The electrolyte may include, consist essentially of, or consist of a basic solution. The electrolyte may include, consist essentially of, or consist of trisodium phosphate. Anodizing the base layer may include, consist essentially of, or consist of applying an electrolyte to the base layer while applying a voltage to the electrolyte and/or to the base layer without immersing the base layer in the electrolyte. The electrolyte may be applied to the base layer using a brush electrode. The base layer may be anodized at room temperature.

A mask layer may be formed or disposed over the conductor layer. The mask layer may include, consist essentially of, or consist of photoresist, an oxide layer, a nitride layer, and/or an oxynitride layer. The mask layer may be patterned to reveal a portion of the conductor layer. A remaining portion of the mask layer may at least partially define a shape of an electrode. Thereafter, portions of the conductor layer and the bilayer barrier layer not masked by the patterned mask layer may be removed. A second base layer may be deposited over at least a portion of the conductor layer. The second base layer may include, consist essentially of, or consist of an alloy of Cu and/or Mo with one or more second anodizable alloying elements selected from the list consisting of Ta, Nb, Al, Hf, Zr, Ti, and Mg. The one or more second anodizable alloying elements may be present individually or in combination at a concentration of 0.5 weight %-50 weight %. The second base layer may be anodized to form a bilayer capping layer. The bilayer capping layer may include, consist essentially of, or consist of (i) a second dielectric layer and (ii) a remaining portion of the second base layer disposed beneath the second dielectric layer. The second dielectric layer may include, consist essentially of, or consist of an oxide, nitride, or oxynitride of one or more (or even all) of the one or more second anodizable alloying elements. The base layer may include, consist essentially of, or consist of an alloy the same as that of the second base layer. The base layer may include, consist essentially of, or consist of an alloy different from that of the second base layer.

In another aspect, embodiments of the invention feature a method of forming an interconnect of a touch-panel display. The method includes providing structure including consisting essentially of, or consisting of (i) a substrate, (ii) a plurality of conductive touch-panel row sensors (a) arranged in lines extending along a first direction and (b) disposed over the substrate, and (iii) a plurality of conductive touch-panel column sensors (a) arranged in lines extending along a second direction and intersecting the lines of the row sensors and (b) disposed over the substrate. An insulator layer is deposited or formed at least at a point of intersection between a line of row sensors and a line of column sensors. A conductor layer is deposited or formed over the insulator layer. The conductor layer may be in direct mechanical contact with the insulator layer. A base layer is deposited or formed over the conductor layer. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The base layer is anodized to form a bilayer capping layer. The bilayer capping layer includes, consists essentially of, or consists of (i) a dielectric layer and (ii) a remaining portion of the base layer disposed beneath the dielectric layer. A mask layer is formed or deposited over the bilayer capping layer. The mask layer is patterned to reveal a portion of the bilayer capping layer, a remaining portion of the mask layer at least partially defining a shape of the interconnect. After the mask layer is patterned, portions of the bilayer capping layer and the conductor layer not masked by the patterned mask layer are removed.

Embodiments of the invention may include one or more of the following in any of a variety of combinations. The dielectric layer may include, consist essentially of, or consist of an oxide, nitride, or oxynitride of one or more (or even all) of the one or more anodizable alloying elements. Anodizing the base layer may include, consist essentially of, or consist of immersing at least a portion of the base layer in an electrolyte and applying a voltage to the base layer (e.g., between the base layer and an electrode (e.g., a cathode)). The electrolyte may include, consist essentially of, or consist of an acidic solution. The electrolyte may include, consist essentially of, or consist of sulfuric acid, nitric acid, chromic acid, and/or phosphoric acid. The electrolyte may include, consist essentially of, or consist of a basic solution. The electrolyte may include, consist essentially of, or consist of trisodium phosphate. Anodizing the base layer may include, consist essentially of, or consist of applying an electrolyte to the base layer while applying a voltage to the electrolyte and/or to the base layer without immersing the base layer in the electrolyte. The electrolyte may be applied to the base layer using a brush electrode. The base layer may be anodized at room temperature.

In yet another aspect, embodiments of the invention feature a method of forming a bilayer capping layer for a metallic feature of an electronic device. A conductor layer is formed or deposited over a substrate. The conductor layer may be in direct mechanical contact with the substrate. A base layer is deposited or formed over the conductor layer.

The base layer may be in direct mechanical contact with the conductor layer. The base layer includes, consists essentially of, or consists of an alloy of Cu and/or Mo with one or more anodizable alloying elements selected from the list consisting of Ta, Nb, Al, Hf, Zr, Ti, and Mg. The one or more anodizable alloying elements may be present individually or in combination at a concentration of 0.5 weight %-50 weight %. The base layer is anodized to form a bilayer capping layer. The bilayer capping layer includes, consists essentially of, or consists of (i) a dielectric layer and (ii) a remaining portion of the base layer disposed beneath the dielectric layer.

Embodiments of the invention may include one or more of the following in any of a variety of combinations. The dielectric layer may include, consist essentially of, or consist of an oxide, nitride, or oxynitride of one or more (or even all) of the one or more anodizable alloying elements. Anodizing the base layer may include, consist essentially of, or consist of immersing at least a portion of the base layer in an electrolyte and applying a voltage to the base layer (e.g., between the base layer and an electrode (e.g., a cathode)). The electrolyte may include, consist essentially of, or consist of an acidic solution. The electrolyte may include, consist essentially of, or consist of sulfuric acid, nitric acid, chromic acid, and/or phosphoric acid. The electrolyte may include, consist essentially of, or consist of a basic solution. The electrolyte may include, consist essentially of, or consist of trisodium phosphate. Anodizing the base layer may include, consist essentially of, or consist of applying an electrolyte to the base layer while applying a voltage to the electrolyte and/or to the base layer without immersing the base layer in the electrolyte. The electrolyte may be applied to the base layer using a brush electrode. The base layer may be anodized at room temperature.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function. As used herein, "consisting essentially of at least one metal" refers to a metal or a mixture of two or more metals but not compounds between a metal and a non-metallic element or chemical species such as oxygen or nitrogen (e.g., metal nitrides or metal oxides); such non-metallic elements or chemical species may be present, collectively or individually, in trace amounts, e.g., as impurities. As used herein, "columns" and "rows" refer to elements arranged in different directions (and that may intersect), and are otherwise arbitrary unless otherwise noted; i.e., an arrangement of elements may be a row or a column, regardless of its orientation in space or within a device. As used herein, "substrate" or "base layer" refers to a support member (e.g., a semiconductor substrate such as silicon, GaAs, GaN, SiC, sapphire, or InP, or a platform including or consisting essentially of another material, e.g., an insulating material such as glass) with or without one or more additional layers disposed thereon, or to the one or more additional layers themselves.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
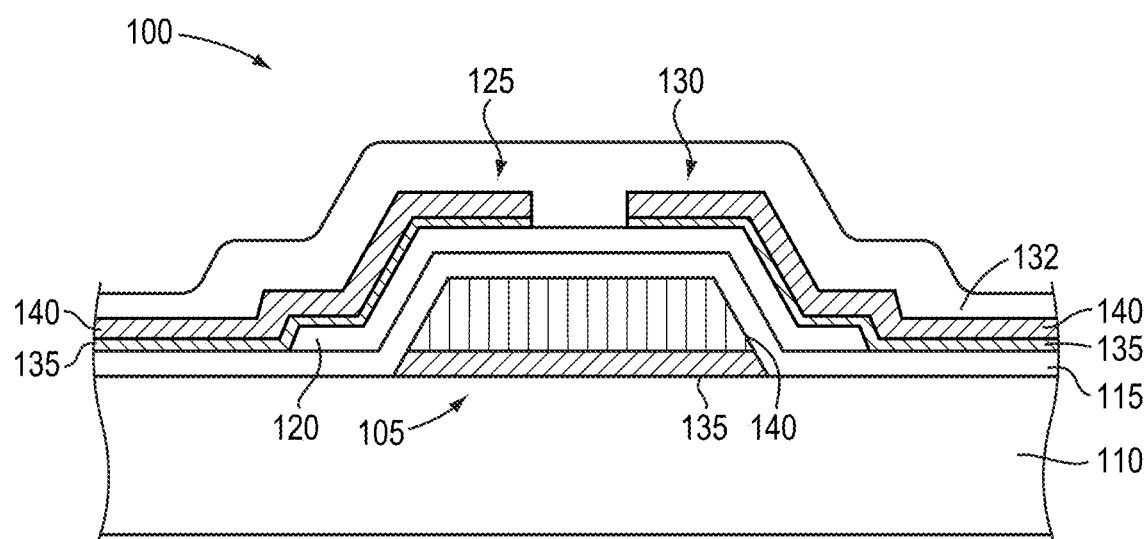
FIG. 1 is a schematic cross-section of a thin-film transistor for a liquid crystal display.
Figure 2A:
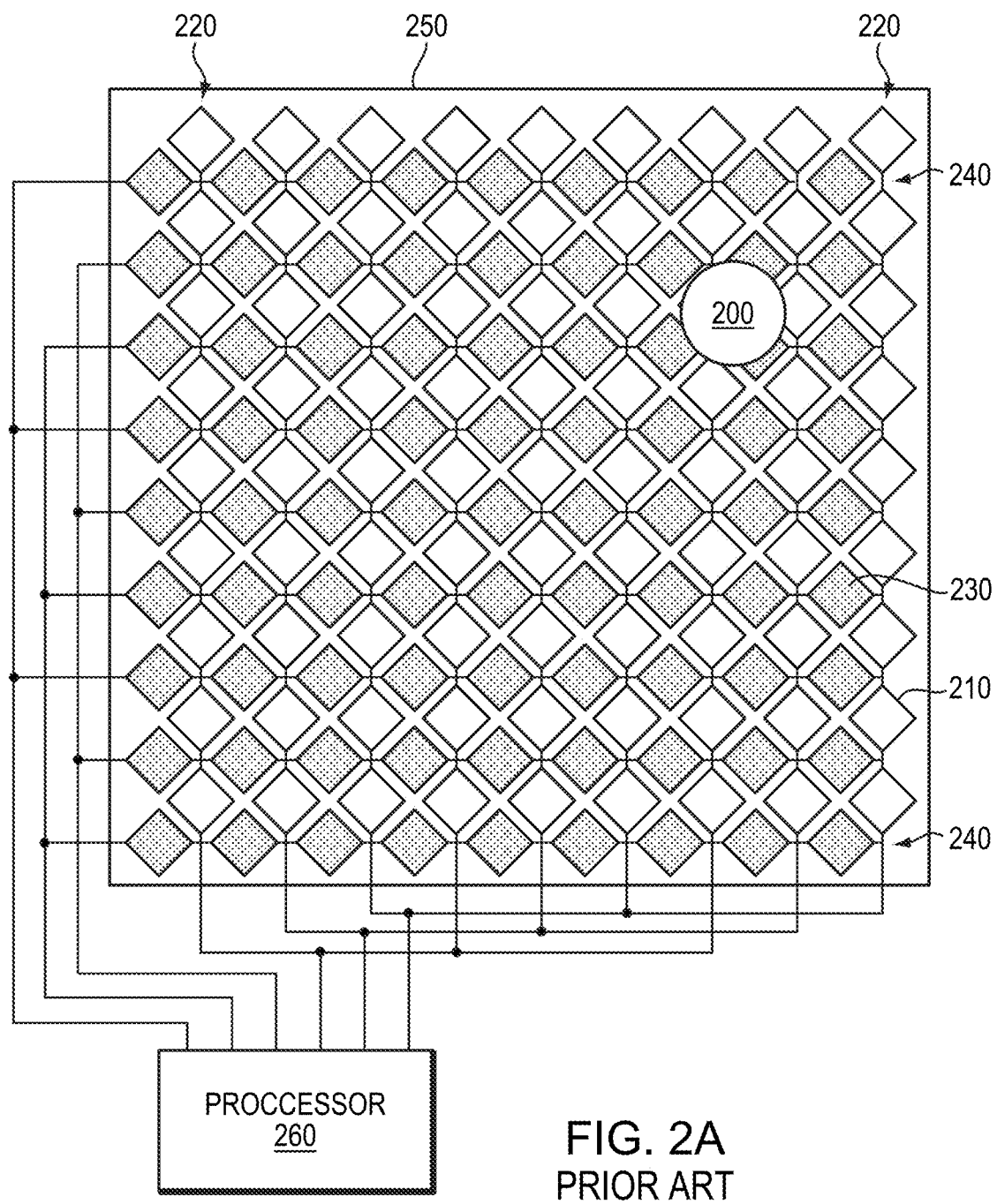
FIG. 2A is a plan-view schematic of the sensor array of a touch-panel display.
Figure 2B:
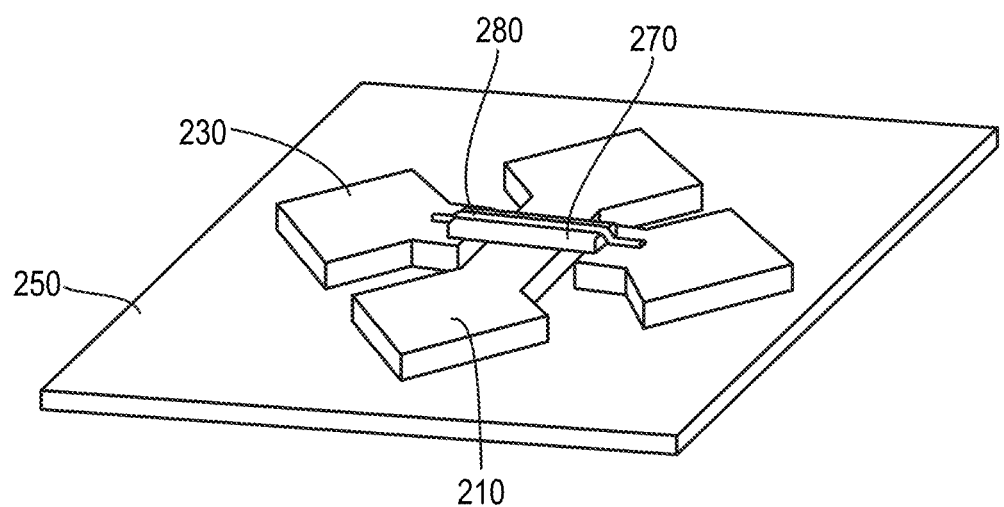
FIG. 2B is a magnified perspective view of a portion of the sensor array of FIG. 2A.
Figure 2C:
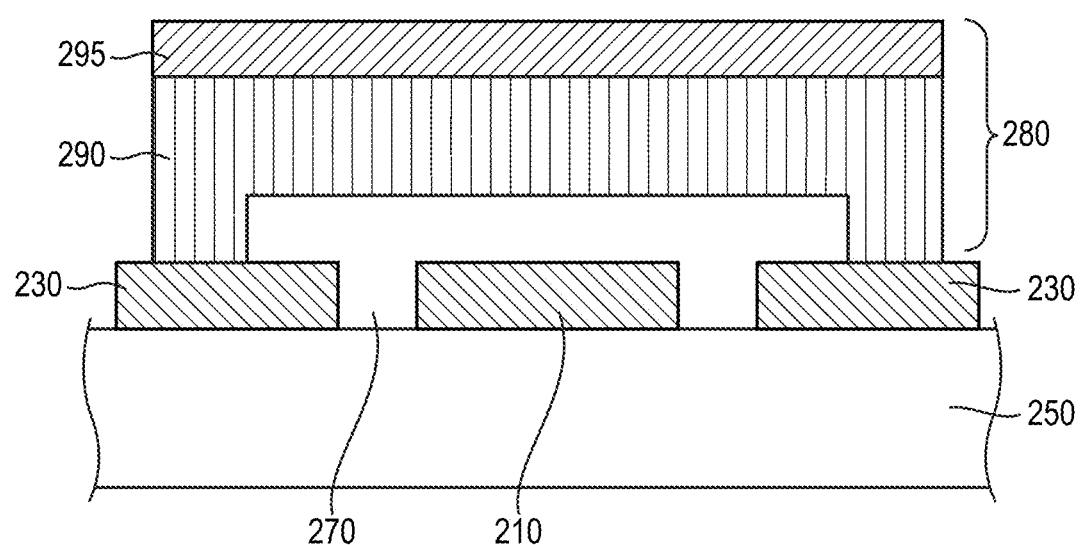
FIG. 2C is a schematic cross-section of the sensor-array portion of FIG. 2B.
Figure 3A:
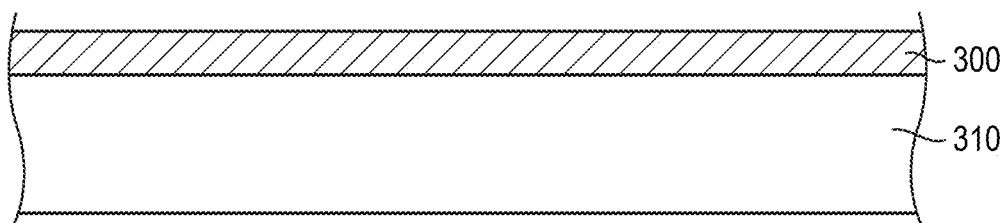
FIGS. 3A-3D are schematic cross-sections of a TFT electrode during fabrication in accordance with various embodiments of the invention.
Figure 3B:
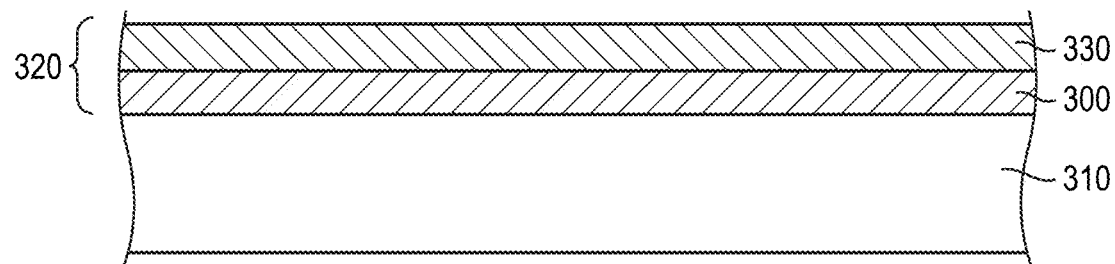

FIG. 3A depicts an initial step in the fabrication of a TFT gate electrode in accordance with embodiments of the present invention. As shown, a base layer 300 is deposited on a substrate 310 (e.g., a glass or silicon substrate) by, e.g., sputtering, co-sputtering (i.e., from two or more elemental-metal sputtering targets) or other physical deposition process. In various embodiments, the base layer 300 includes, consists essentially of, or consists of an alloy of Cu and/or Mo (and/or other non-anodizable metal) with up to 20%, or even up to 50%, (and at least, e.g., 0.5% or 1%) of one or more anodizable metallic elements (e.g., Ta, Nb, Al, Hf, Zr, Ti, and/or Mg). As shown in FIG. 3B, the base layer 300 is then anodized to form a bilayer barrier layer 320 composed of the remaining portion of the base layer 300 and an overlying dielectric layer 330 that includes, consists essentially of, or consists of an oxide and/or nitride of the one or more alloying elements. Since Cu and Mo are typically not anodizable, the dielectric layer 330 may be substantially free of Cu and Mo. In addition, an interfacial region of the base layer 300 (i.e., the portion of the base layer directly underlying and in contact with the dielectric layer) may be depleted in, or may even be substantially free of, the anodizable metallic element(s), which may be preferentially "consumed" in the anodizing process. This interfacial region of the base layer 300 may have a thickness of, for example, 1 nm-20 nm. Rather than being fully depleted in the alloying elements, the interfacial region may contain one or more of the alloying elements but in a concentration that decreases toward the dielectric layer 330.

Figure 3C:
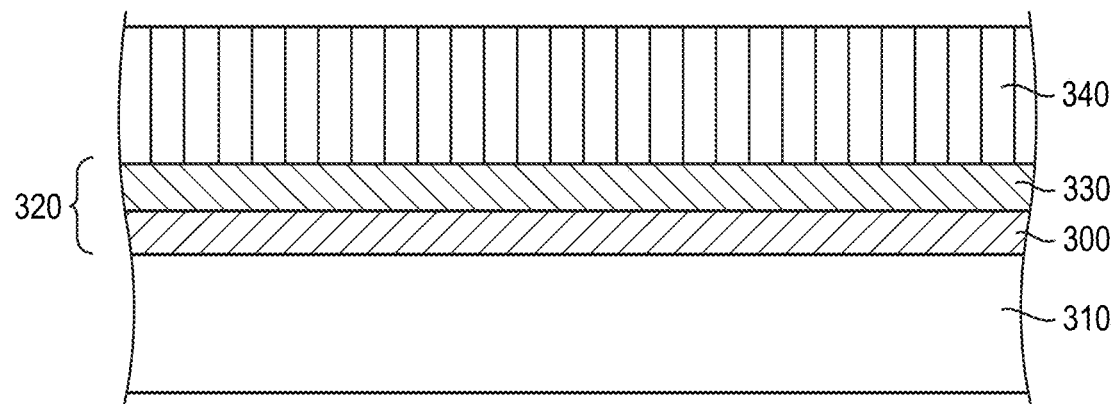
Figure 3D:
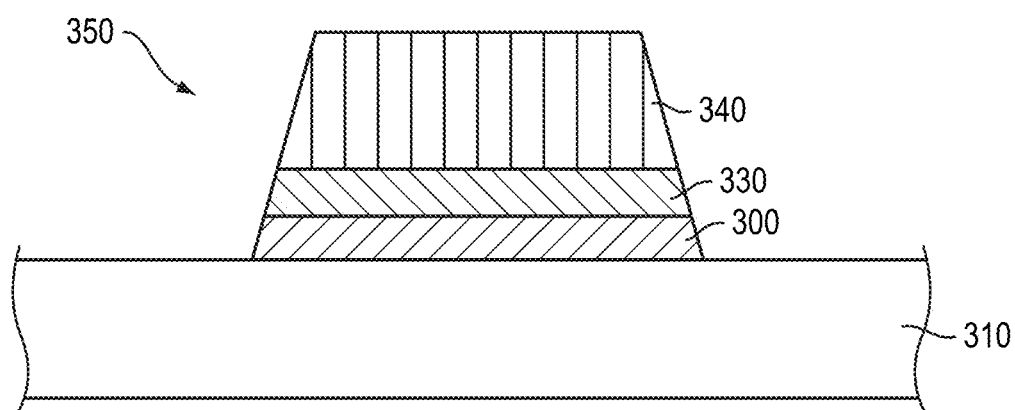

As shown in FIG. 3C, a conductor layer 340 may be deposited on the barrier layer 320 by, e.g., sputtering or other physical deposition process. The conductor layer 340 may include, consist essentially of, or consist of a highly conductive metal such as, for example, Cu, Ag, Al, and/or Au, or an alloy or mixture containing two or more of these metals or one or more of these metals with one or more other elements (e.g., other metals). In various embodiments, the conductor layer 340 is not anodizable (i.e., does not form a dielectric layer of any appreciable or detectable thickness upon subjection to an electrochemical anodization process or forms a dielectric layer that is unstable, not corrosion resistant, and/or that is easily mechanically removed; for example, while ferrous metals (i.e., metals comprising, consisting essentially of, or consisting of iron) oxidize, the resulting dielectric layer is often unstable and may easily flake off). Typically the thickness of the barrier layer 320 will be between approximately 5% and approximately 25% (e.g., approximately 10%) of the thickness of conductor layer 340. The conductor layer 340 and the barrier layer 320 may be subsequently patterned by conventional photolithography processes to form a gate electrode 350, as shown in FIG. 3D. For example, a mask layer (e.g., photoresist) may be formed over the conductor layer, the mask layer may be patterned, and the unmasked areas of the conductor layer 340 and the barrier layer 320 may be removed via, e.g., wet or dry etching.

Figure 4A:
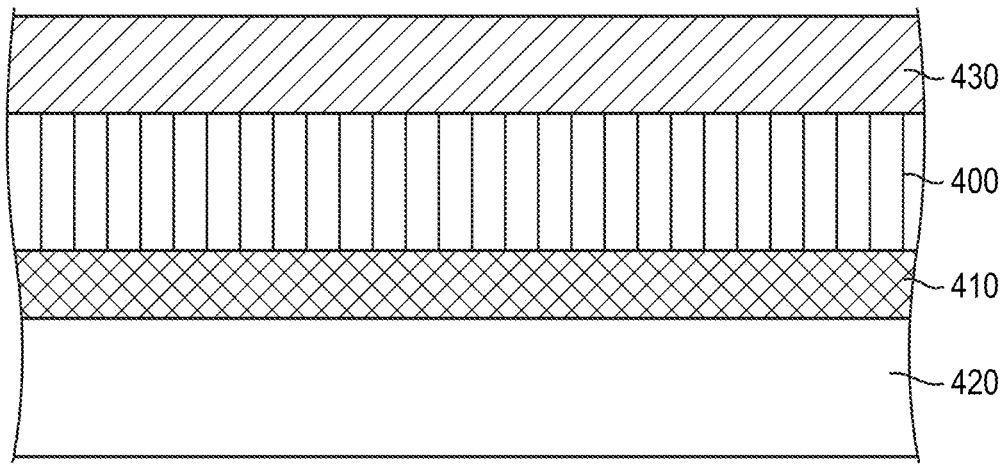
FIGS. 4A-4C are schematic cross-sections of an interconnect for a touch-panel display during fabrication in accordance with various embodiments of the invention.

FIG. 4A depicts an initial step in the fabrication of a touch-panel sensor interconnect in accordance with embodiments of the present invention. As shown, a conductor layer 400 is deposited over a sensor 410 (e.g., a row or column sensor that may include, consist essentially of, or consist of, e.g., a transparent conductor such as ITO) on a substrate 420 (e.g., a glass or silicon substrate) by, e.g., sputtering or other physical deposition process. A base layer 430 is subsequently deposited on the conductive layer 400 by, e.g., sputtering, co-sputtering, or other physical deposition process. In various embodiments, the base layer 430 includes, consists essentially of, or consists of an alloy of Cu and/or Mo (and/or other non-anodizable metal) with up to 20%, or even up to 50%, of one or more anodizable metallic elements (e.g., Ta, Nb, Al, Hf, Zr, Ti, and/or Mg). The conductor layer 400 may include, consist essentially of, or consist of a highly conductive metal such as, for example, Cu, Ag, Al, and/or Au, or an alloy or mixture containing two or more of these metals or one or more of these metals with one or more other elements (e.g., other metals). In various embodiments, the conductor layer 400 is not anodizable.

Figure 4B:
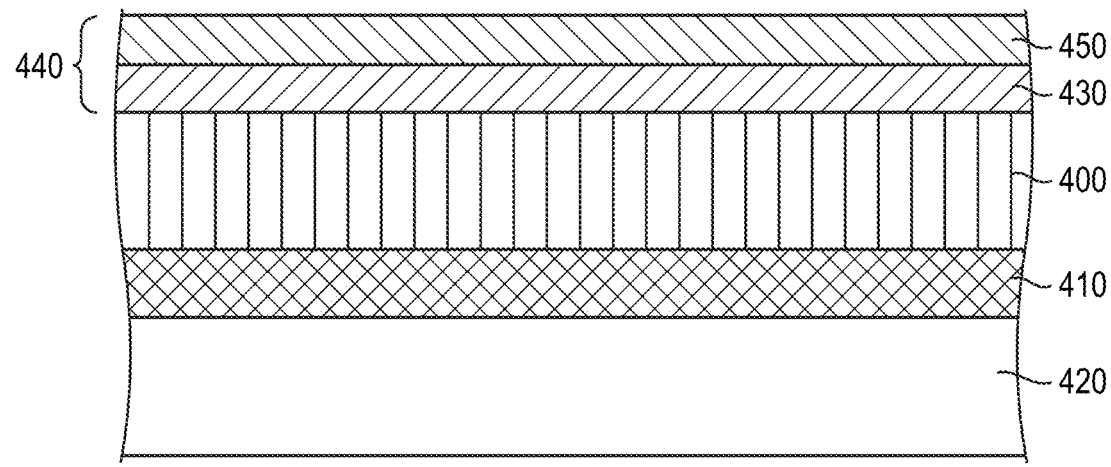

As shown in FIG. 4B, the base layer 430 is then anodized to form a bilayer capping layer 440 composed of the remaining portion of the base layer 430 and an overlying dielectric layer 450 that includes, consists essentially of, or consists of an oxide and/or nitride of the one or more alloying elements. Since Cu and Mo are typically not anodizable, the dielectric layer 450 may be substantially free of Cu and Mo (e.g., containing less than approximately 5%, or even less than approximately 1%, Cu and Mo). In addition, an interfacial region of the base layer 430 (i.e., the portion of the base layer directly underlying and in contact with the dielectric layer) may be depleted in, or may even be substantially free of, the anodizable metallic element(s), which may be preferentially "consumed" in the anodizing process. This interfacial region of the base layer 430 may have a thickness of, for example, 1 nm-20 nm. Rather than being fully depleted in the alloying elements, the interfacial region may contain one or more of the alloying elements but in a concentration that decreases toward the dielectric layer 450.

Figure 4C:
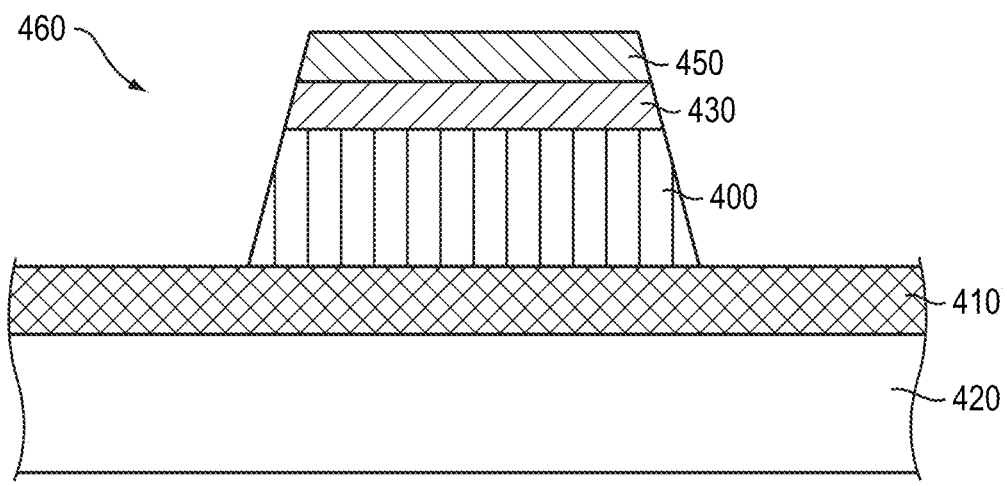

As shown in FIG. 4C, the capping layer 440 and the conductor layer 400 may be subsequently patterned by conventional photolithography processes to form an interconnect 460. For example, a mask layer (e.g., photoresist) may be formed over the capping layer 440, the mask layer may be patterned, and the unmasked areas of the capping layer 440 and conductor layer 400 may be removed via, e.g., wet or dry etching.

In various embodiments, the conductor layer 400 is not anodizable (e.g., consists essentially or consists of Cu), and the base layer 430 is anodized after patterning of the interconnect 460. In such embodiments, the base layer 430 and conductor layer 400 may be patterned as described above, and then the base layer 430 is anodized to form the overlying dielectric layer 450. Since the conductor layer 400 is not anodizable, it is not affected by the anodization process, and only exposed regions of the base layer 430 are anodized to form overlying dielectric layers 450.

Figure 5:
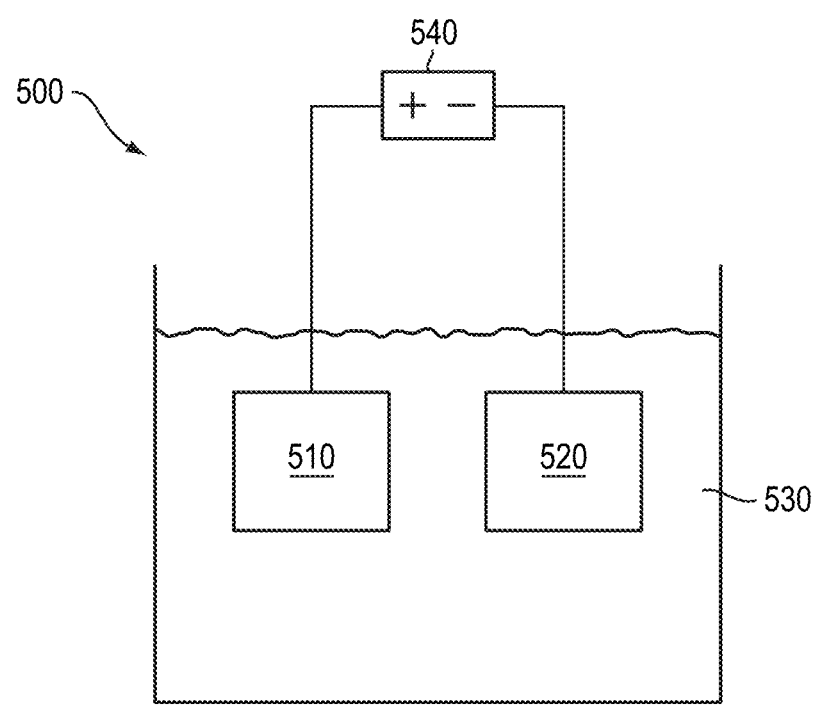
FIG. 5 is a schematic of an apparatus utilized for anodization in accordance with various embodiments of the invention.

FIG. 5 depicts a schematic of an apparatus 500 for the anodizing of the base layer in accordance with embodiments of the present invention. As shown, a base layer 510 and a cathode material 520 are immersed in an electrolyte 530 and electrically coupled to a power supply 540. The cathode 520 may include, consist essentially of, or consist of, e.g., Pt, Al, Pb, or Ta. Upon application of a voltage by power supply 540, current flows through the electrolyte 530, leading to formation of a dielectric layer on the base layer 510. For example, oxygen and/or nitrogen may be liberated from the electrolyte and react with the one or more alloying elements within the base layer 510 to form the dielectric layer. In various embodiments, hydrogen and/or one or more other gaseous by-products are produced at the cathode 520. The thickness of the resulting dielectric layer may be controlled by, e.g., varying the voltage applied by the power supply 540. The electrolyte 530 may include, consist essentially or, or consist of one or more acidic solutions such as sulfuric acid, nitric acid, chromic acid, or phosphoric acid. In other embodiments, the electrolyte 530 may include, consist essentially of, or consist of one or more basic solutions such as aqueous sodium phosphate (e.g., trisodium phosphate). In general, the electrolyte 530 has a pH greater than or lower than 7. For example, the pH of the electrolyte 530 may be 6 or less (e.g., between 0 and 6, or between 1 and 6, or between 0 and 5, or between 0 and 4, or between 0 and 3), or the pH of the electrolyte 530 may be 8 or more (e.g., between 8 and 14, or between 8 and 13, or between 9 and 14, or between 10 and 14) Even though the electrolyte 530 may be acidic, in various embodiments of the invention the only portion of the base layer consumed in the anodization process is the portion oxidized and/or nitrided to form the dielectric layer—i.e., the base layer is not otherwise etched or patterned during the anodizing process. The anodizing process may be performed as a batch (i.e., multiple-substrate) process or as a single-substrate process. Advantageously, the anodizing process in embodiments of the present invention may be performed at room temperature (e.g., approximately 25° C.), thereby enabling formation of anodized dielectric layers (and thus bilayer capping and/or barrier layers) even on substrates containing heat-sensitive elements.

In various embodiments of the invention, the base layer 510 may be anodized without immersion in the electrolyte 530. For example, the electrolyte 530 may be applied to all or a portion of the surface of the base layer 510 (e.g., with a brush electrode and/or by spraying) while voltage is applied to the electrolyte 530 (e.g., via a power source connected to the brush electrode) and/or the base layer 510.

Figure 6:
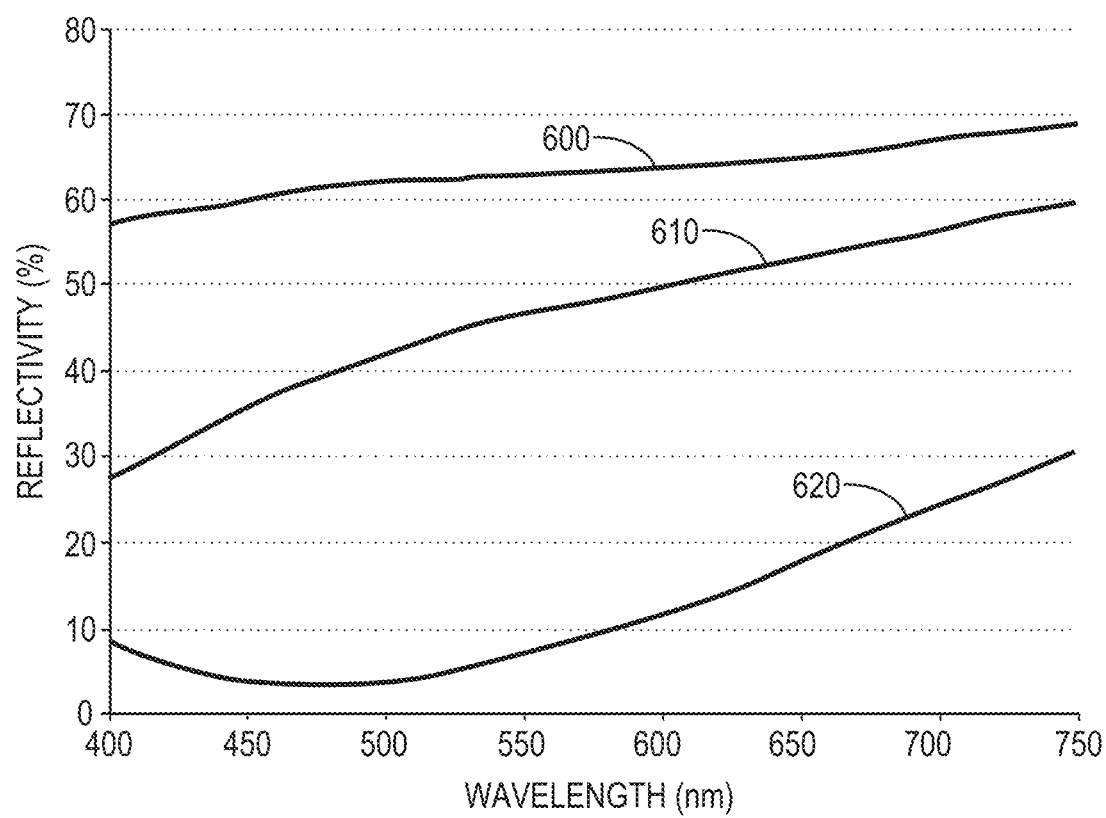
FIG. 6 is a graph of reflectivity of a layer, as a function of wavelength, before anodization and after anodization at two different applied voltages in accordance with various embodiments of the invention.

Bilayer barrier layers and capping layers in accordance with various embodiments of the invention exhibit advantageously low reflectivity, particularly when compared to their base layer constituents alone. FIG. 6 is a graph of reflectivity as a function of wavelength for a 100 nm-thick film of 90% Mo and 10% Nb disposed on a silicon substrate before anodization (reflectivity 600) and after anodization at two different applied voltages (and thus two different thicknesses of the resulting dielectric layer) of 2.2V (reflectivity 610) and 3.0V (reflectivity 620) in a solution of trisodium phosphate (TSP) and water having a pH of approximately 11. As shown, the formation of the overlying dielectric layer reduces the reflectivity of the layer from 58%-70% to 28%-60% (2.2V) to 8%-30% (3.0V). These and all other reflectivity measurements reported herein were performed utilizing a Cary 50 UV-Vis Spectrophotometer available from Varian, Inc. of Palo Alto, Calif. This system is equipped with a dual-beam, Czerny-Turner monochromator capable of measuring 190-1100 nm wavelength range, having approximately 1.5 nm fixed spectral bandwidth, and utilizing a full-spectrum Xe pulse lamp single source. The system was calibrated with the supplied highly reflective (~100%) calibration sample prior to each measurement. The reflectivity data shown in FIG. 6 (and other figures herewith) are plotted without any post-processing. The anodizations performed in accordance with the examples presented herein were performed for times ranging from approximately 10 seconds to approximately 50 seconds unless otherwise indicated, although increased anodization time would, in general, have little if any impact on the resulting anodized layers or their properties (e.g., reflectivity).

Figure 7:
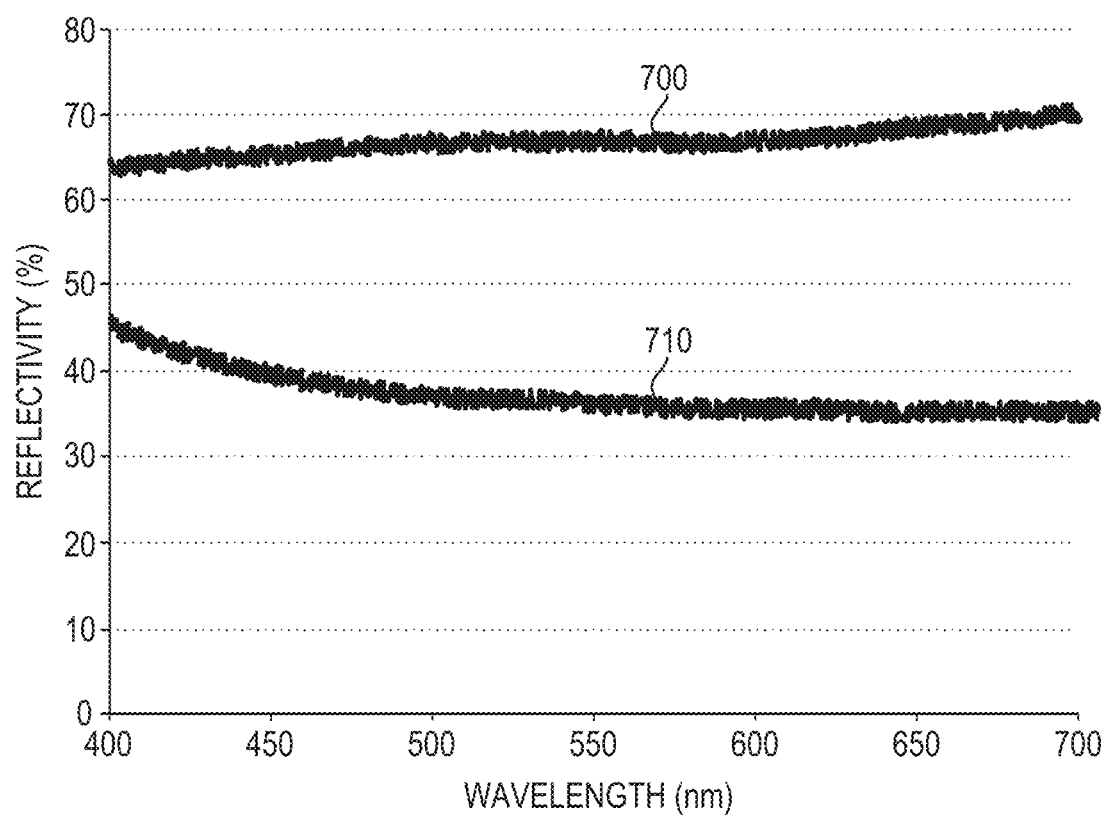
FIG. 7 is a graph of reflectivity of a layer, as a function of wavelength, before and after anodization in accordance with various embodiments of the invention.
Figure 8:
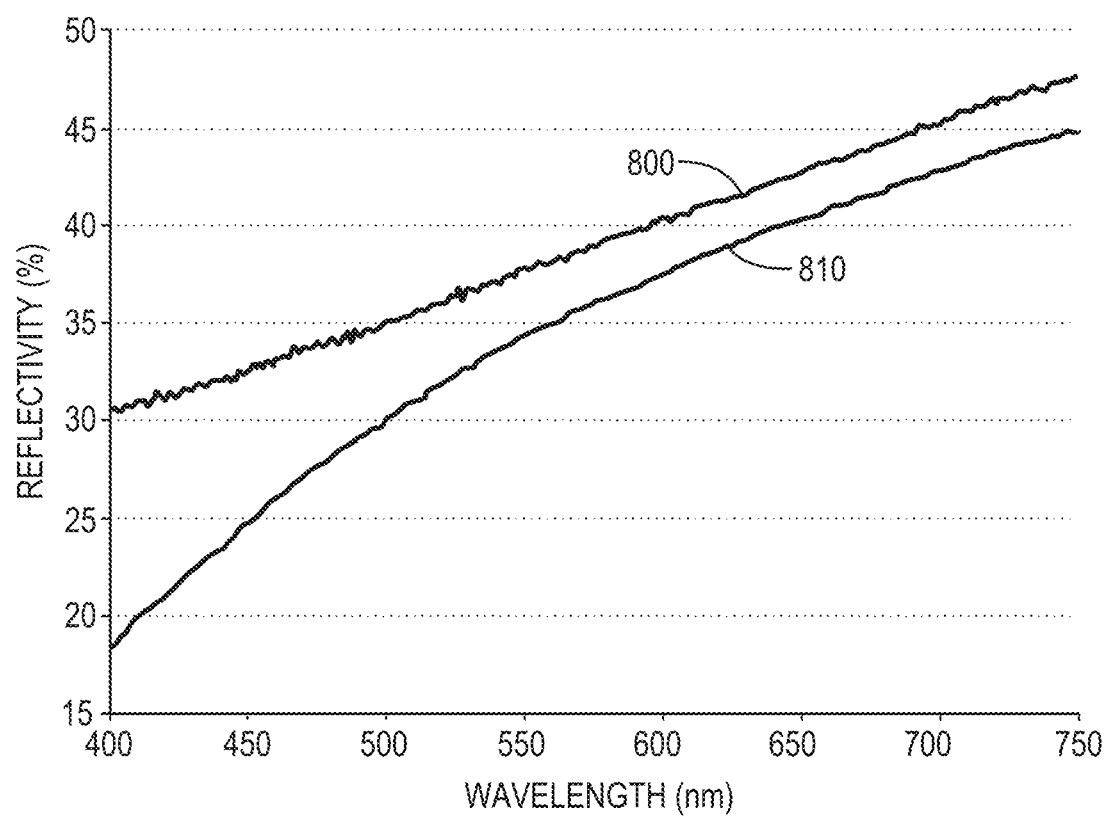
FIG. 8 is a graph of reflectivity of a layer, as a function of wavelength, before and after anodization in accordance with various embodiments of the invention.

FIG. 7 is a similar graph of reflectivity as a function of wavelength for a 100 nm-thick film of 91% Mo, 6% Nb, and 3% Ta on a silicon substrate before anodization (reflectivity 700) and after anodization at an applied voltage of 20V (reflectivity 710) in a solution of TSP and water having a pH of approximately 11. As shown, the formation of the overlying dielectric layer reduces the reflectivity of the layer from 62%-70% to 35%-45%. FIG. 8 is another graph of reflectivity as a function of wavelength for a 100 nm-thick film of 85% Mo, 10% Nb, and 5% Ti on a silicon substrate before anodization (reflectivity 800) and after anodization (reflectivity 810) in a solution of TSP and water having a pH of approximately 11. As shown, the formation of the overlying dielectric layer reduces the reflectivity of the layer from 30%-48% to 18%-45%.

Figure 9:
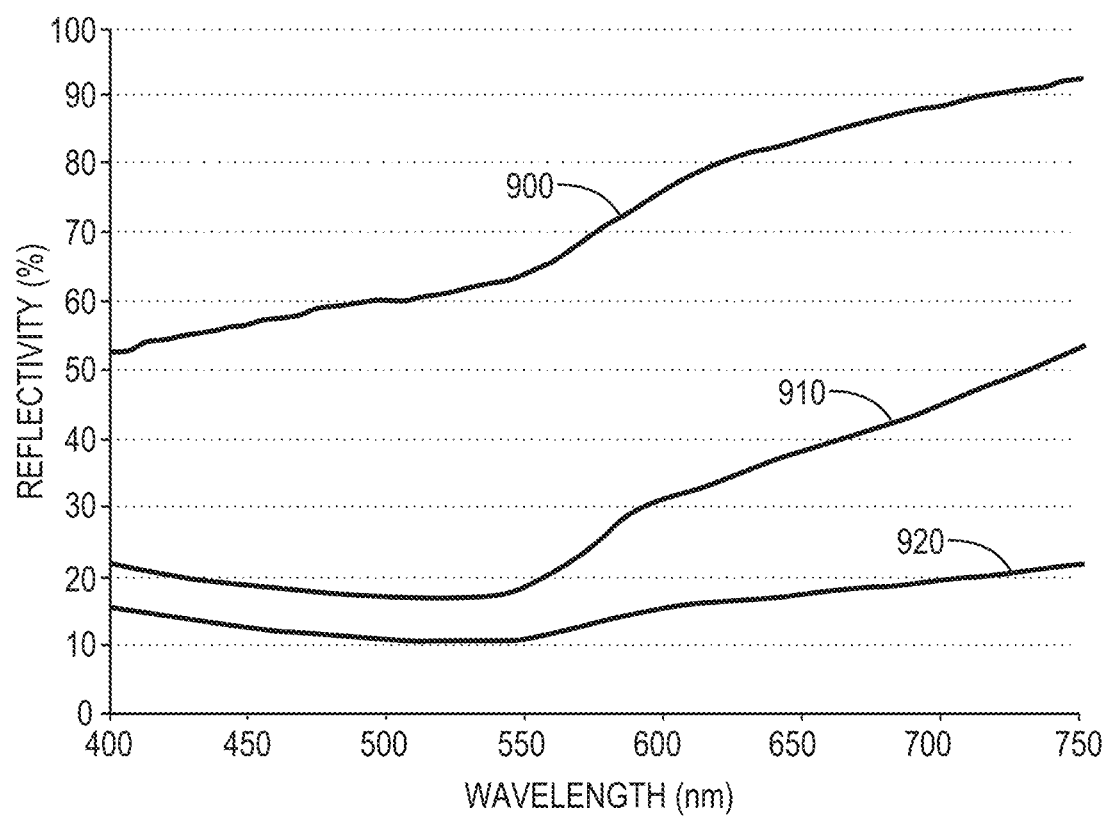
FIG. 9 is a graph of reflectivity of a layer, as a function of wavelength, before and after anodization in accordance with various embodiments of the invention.

FIG. 9 is a graph of reflectivity as a function of wavelength for a 50 nm-thick film of 91% Cu, 4% Ta, and 5% Zr atop a 300 nm-thick layer of Cu on a Si substrate before anodization (reflectivity 900) and after anodization at two different applied voltages (and thus two different thicknesses of the resulting dielectric layer) of 5V (reflectivity 910) and 7V (reflectivity 920) in a solution of phosphoric acid and water having a pH of approximately 4. As shown, the formation of the overlying dielectric layer reduces the reflectivity of the layer from 53%-92% to 22%-52% (5V) to 15%-22% (7V).

Figure 10:
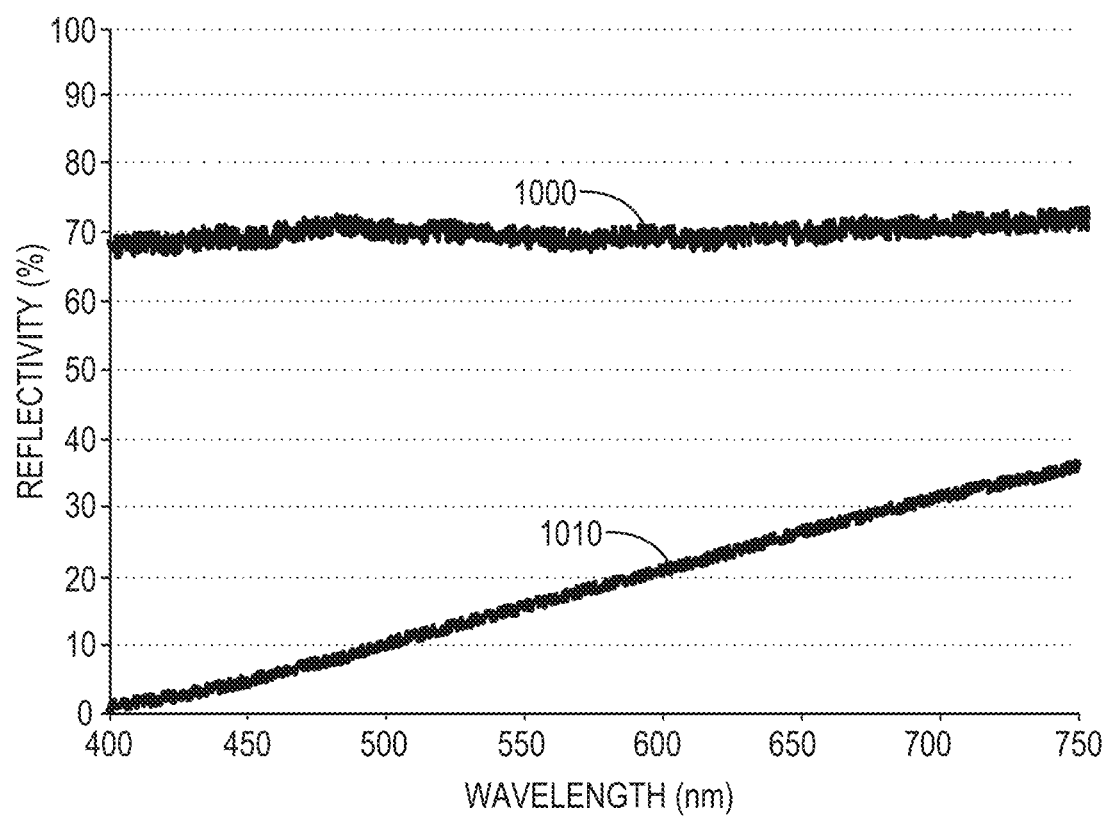
FIG. 10 is a graph of reflectivity of a layer, as a function of wavelength, before and after brush anodization in accordance with various embodiments of the invention.

As discussed herein, layers may be anodized in accordance with embodiments of the present invention without immersion in the electrolyte. FIG. 10 is a graph of reflectivity as a function of wavelength for a 100 nm-thick film of 90% Mo and 10% Nb disposed on a glass substrate before anodization (reflectivity 1000) and after anodization (reflectivity 1010) utilizing a brush electrode and an electrolyte of TSP and water having a pH of approximately 11. As shown, the formation of the overlying dielectric layer reduces the reflectivity of the layer from 68%-70% to 2%-35%.

Figure 11A:
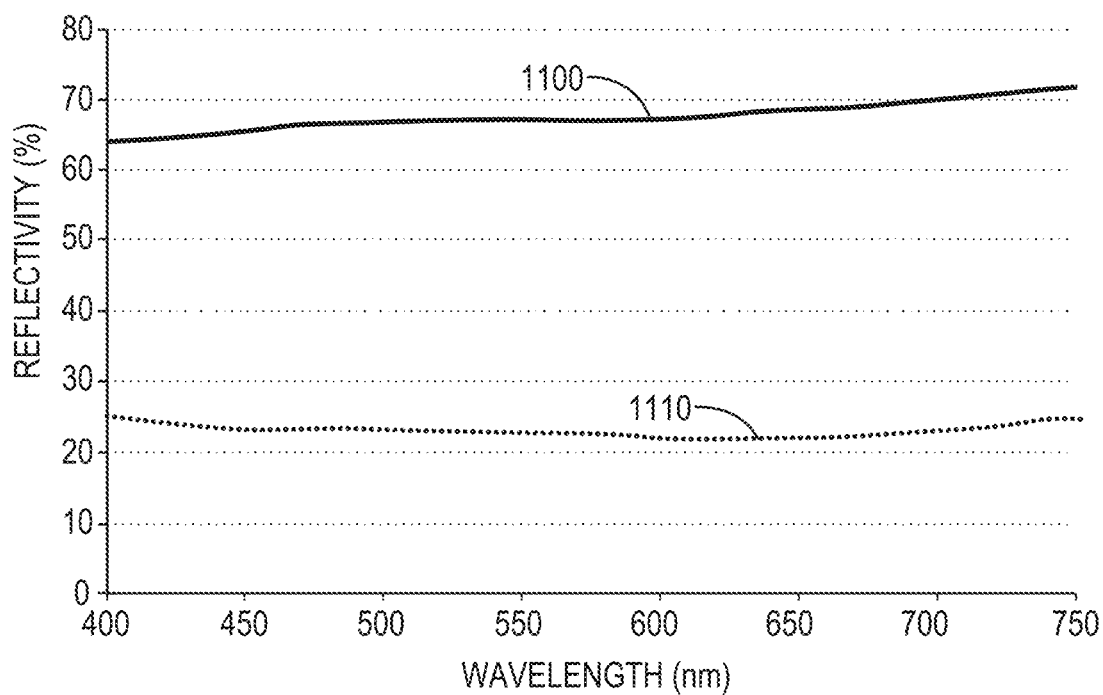
FIG. 11A is a graph of reflectivity, as a function of wavelength, of a non-anodized layer before and after exposure to a corrosive medium.
Figure 11B:
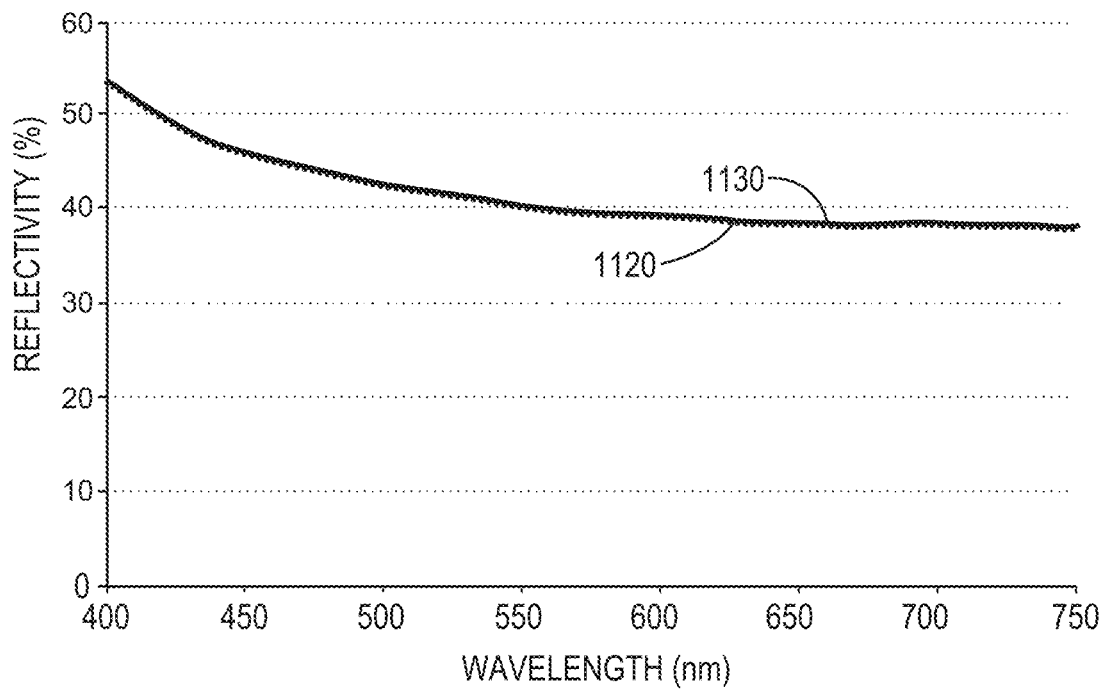
FIG. 11B is a graph of reflectivity, as a function of wavelength, of a layer anodized in accordance with various embodiments of the invention before and after exposure to a corrosive medium.
Figure 12:
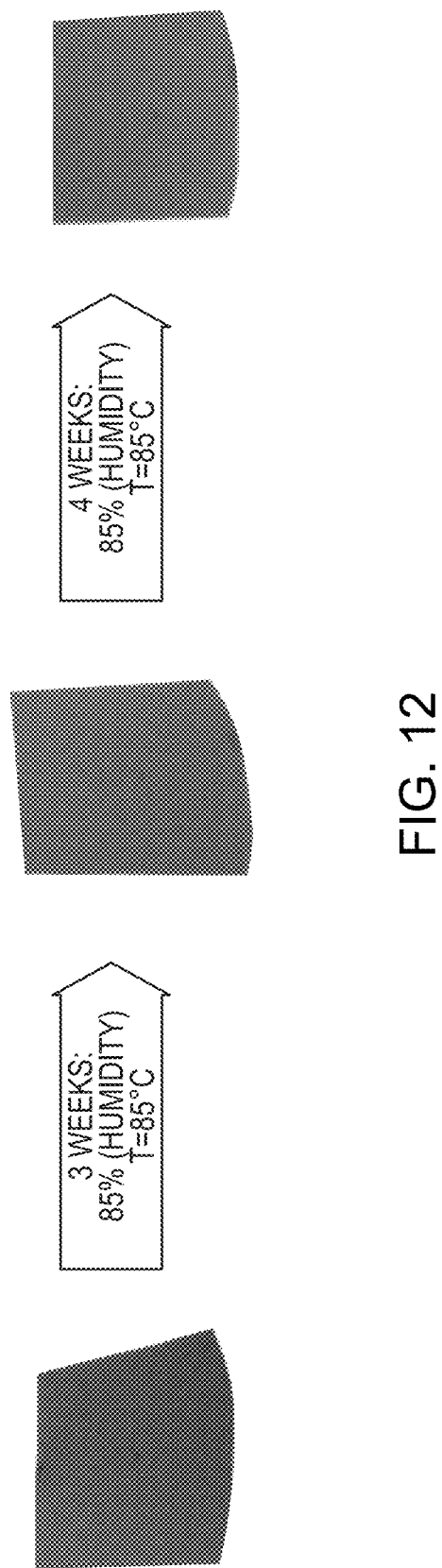
FIG. 12 is a series of images of the layer of FIG. 11B before and during corrosion testing.
Figure 13:
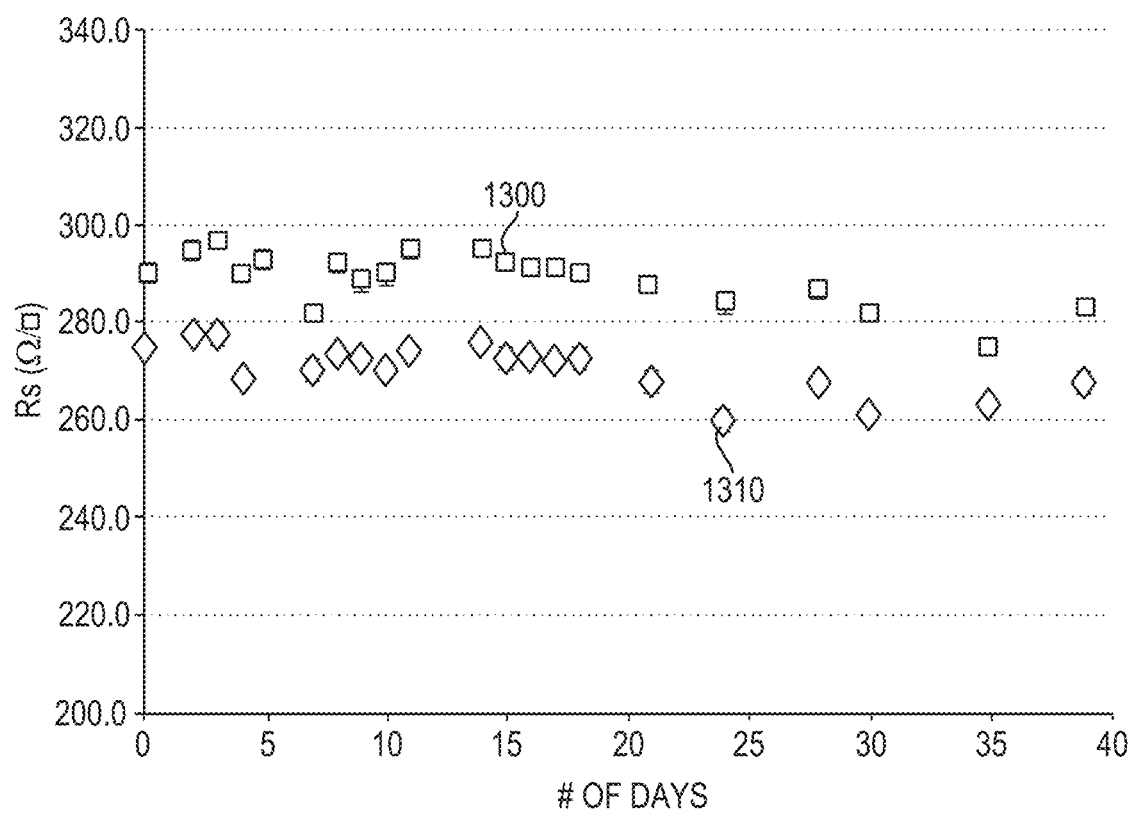
FIG. 13 is a graph of sheet resistance of two different layers anodized in accordance with various embodiments of the invention as a function of time during corrosion testing.

Bilayer capping and barrier layers in accordance with embodiments of the invention also advantageously exhibit stable reflectivity even after exposure to corrosive environments. MoNb (10% Nb) base layers were subjected to a corrosion test in which the non-anodized base layers were exposed to a temperature of 85° C. and humidity of 85% for a period of four weeks. As shown in FIG. 11A, the reflectivity of the bare base layer prior to the corrosion test (reflectivity 1100) decreased dramatically by 40% or more after the corrosion test (reflectivity 1110). In contrast, the bilayer sample exhibited substantially the same reflectivity both before (reflectivity 1120) and after the corrosion test (reflectivity 1130), as shown in FIG. 11B. Furthermore, as shown in FIG. 12, the bilayer sample was defect-free upon visual inspection after both three weeks and four weeks of corrosion testing. FIG. 13 is a graph of sheet resistance of two different anodized layers, 91% Mo, 6% Nb, and 3% Ta (sheet resistance 1300), and 90% Mo and 10% Nb (sheet resistance 1310) as a function of time during a corrosion test involving exposure to a temperature of 85° C. and humidity of 85%. As shown, even after a period of 40 days, the sheet resistance of both samples is substantially the same as on day zero when the test began.

Figure 14:
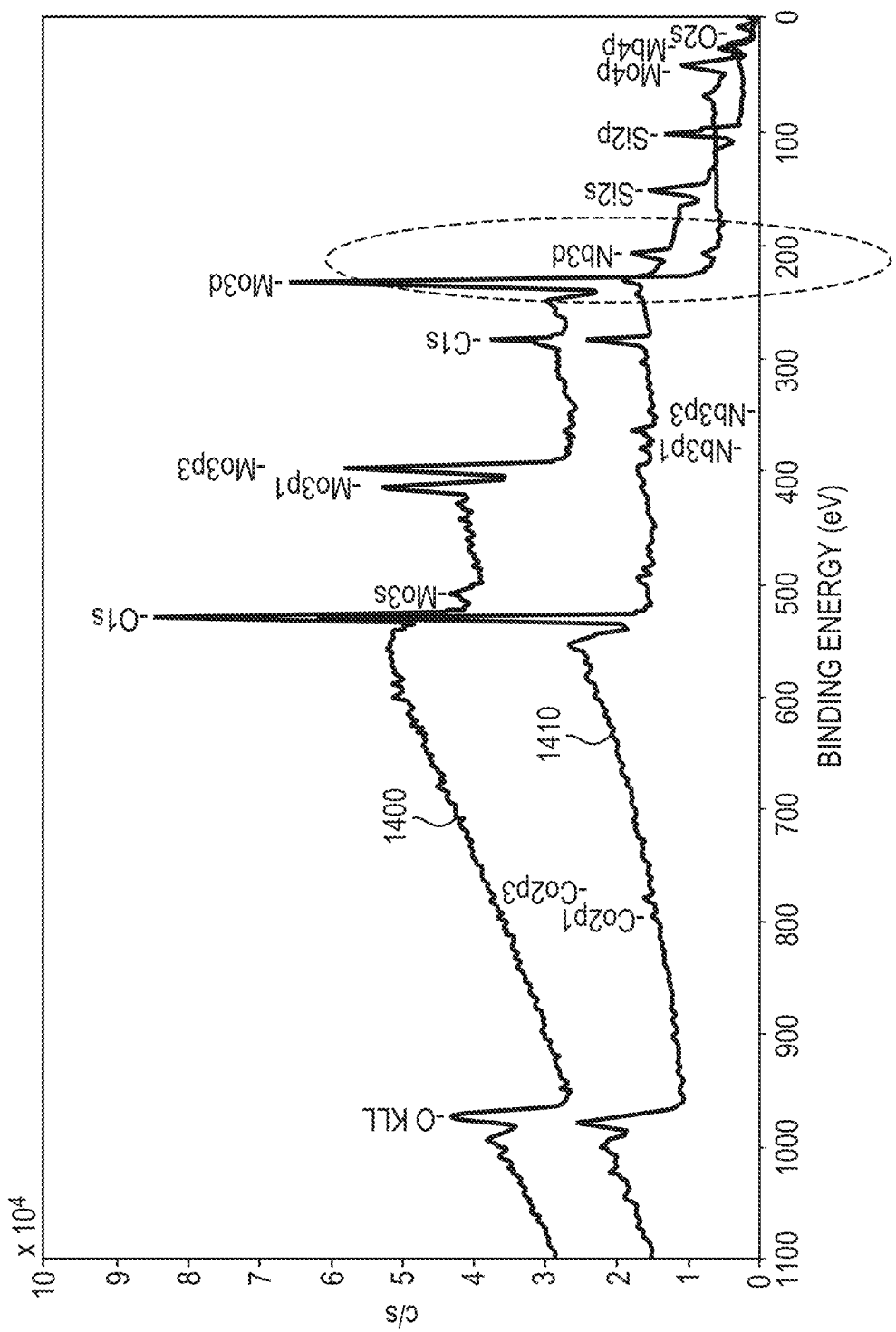
FIG. 14 is a graph comparing the surface chemistry of an oxidized non-anodized layer with that of a layer anodized in accordance with various embodiments of the invention.

FIG. 14 is a comparison of surface chemistry measured using x-ray photoelectron spectroscopy (XPS) for two different layers, each layer being initially composed of 90% Mo and 10% Nb. Sample 1400 was annealed without anodization in air at a temperature of 350° C. for 30 minutes, which resulted in the formation of a Mo oxide thereover. Such a Mo oxide layer is not resistant to corrosion, as shown in FIG. 11A. In contrast, sample 1410 was anodized in a solution of TSP and water having a pH of approximately 11. As shown in FIG. 14, the anodized sample 1410 contains a larger amount of Nb on the surface compared to the annealed sample 1400, indicating that the dielectric layer on the surface of the anodized sample 1410 is based on Nb rather than Mo. As shown in FIG. 11B, such an anodized layer is much more resistant to corrosion.

Figure 15:
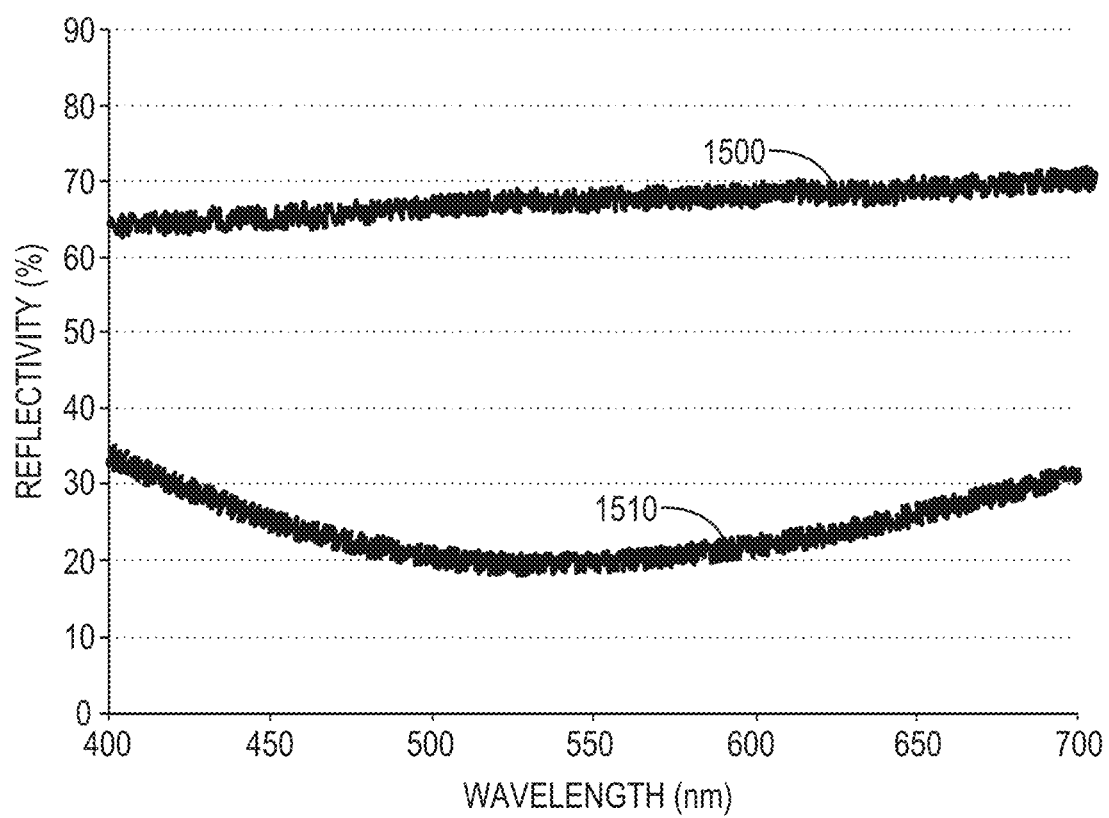
FIG. 15 is a graph of reflectivity of a layer, as a function of wavelength, before and after anodization in accordance with various embodiments of the invention.

Advantageously, dielectric layers formed by anodization in accordance with embodiments of the present invention also do not deleteriously impact the etching behavior of the underlying base layer, thereby facilitating the processing of anodized layers for use as capping layers and barrier layers. FIG. 15 graph of reflectivity as a function of wavelength for a 100 nm-thick film of 85% Mo, 10% Nb, and 5% Zr on a silicon substrate before anodization (reflectivity 1500) and after anodization (reflectivity 1510) at an applied voltage of 5V in a solution of TSP and water having a pH of approximately 11. As shown, the formation of the overlying dielectric layer reduces the reflectivity of the layer from 65%-70% to 20%-35%. Etching studies were performed on (1) the unanodized MoNbZr layer, (2) the same layer having been annealed in air at 350° C. for 15 minutes, thereby forming a Mo oxide thereover, and (3) the anodized MoNbZr layer. Each of the layers was etched in a mixture of phosphoric acid, acetic acid, and nitric acid (a "PAN" etchant) at a temperature of 42° C., and the etch rate was measured. The unanodized and unannealed layer etched at a rate of 34 Å/s, and the anodized layer etched at a rate of 33 Å/s; since the etch rates are substantially identical, this indicates that anodized layers may be incorporated into conventional fabrication processes with little if any changes required in etching and other processing steps. In contrast, the annealed sample was not measurably etched after a period of more than 600 seconds, indicating that such Mo oxide layers not only do not resist corrosion as well as anodized layers in accordance with embodiments of the invention but also cannot be etched using etch processes utilized for the untreated base layers.

Figure 16:
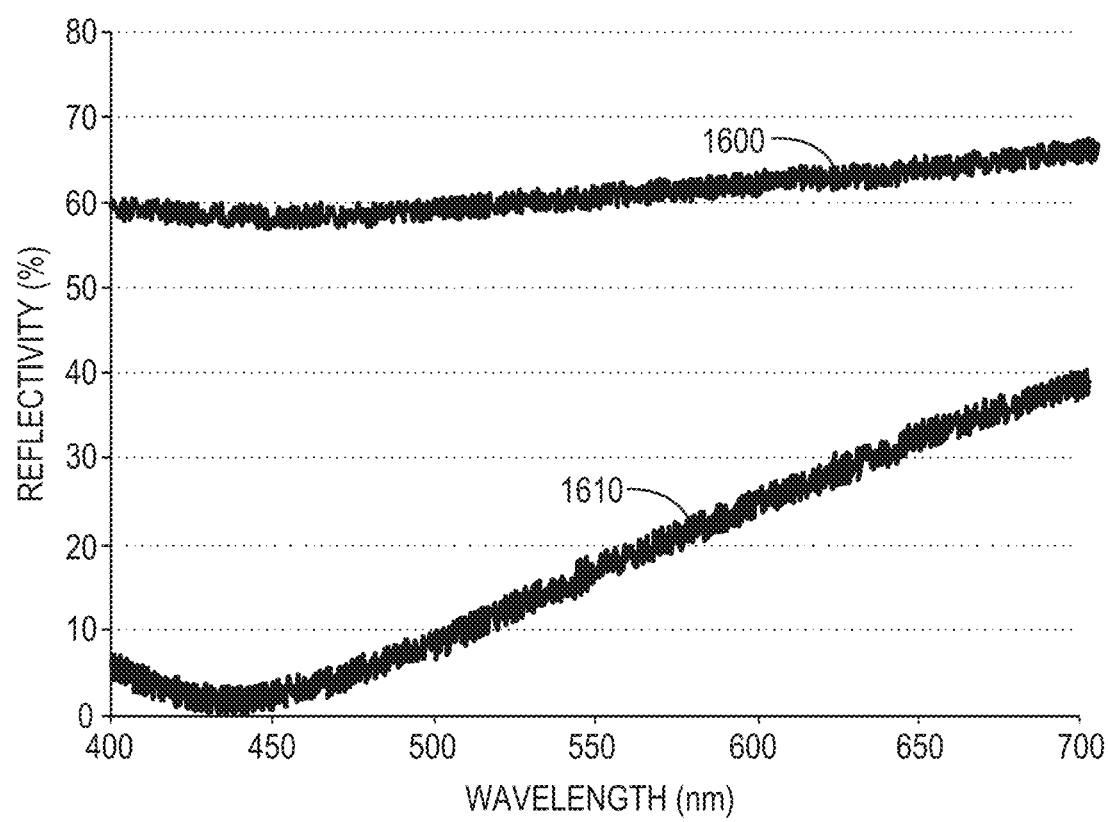
FIG. 16 is a graph of reflectivity of a layer, as a function of wavelength, before and after anodization in accordance with various embodiments of the invention.
Figure 17:
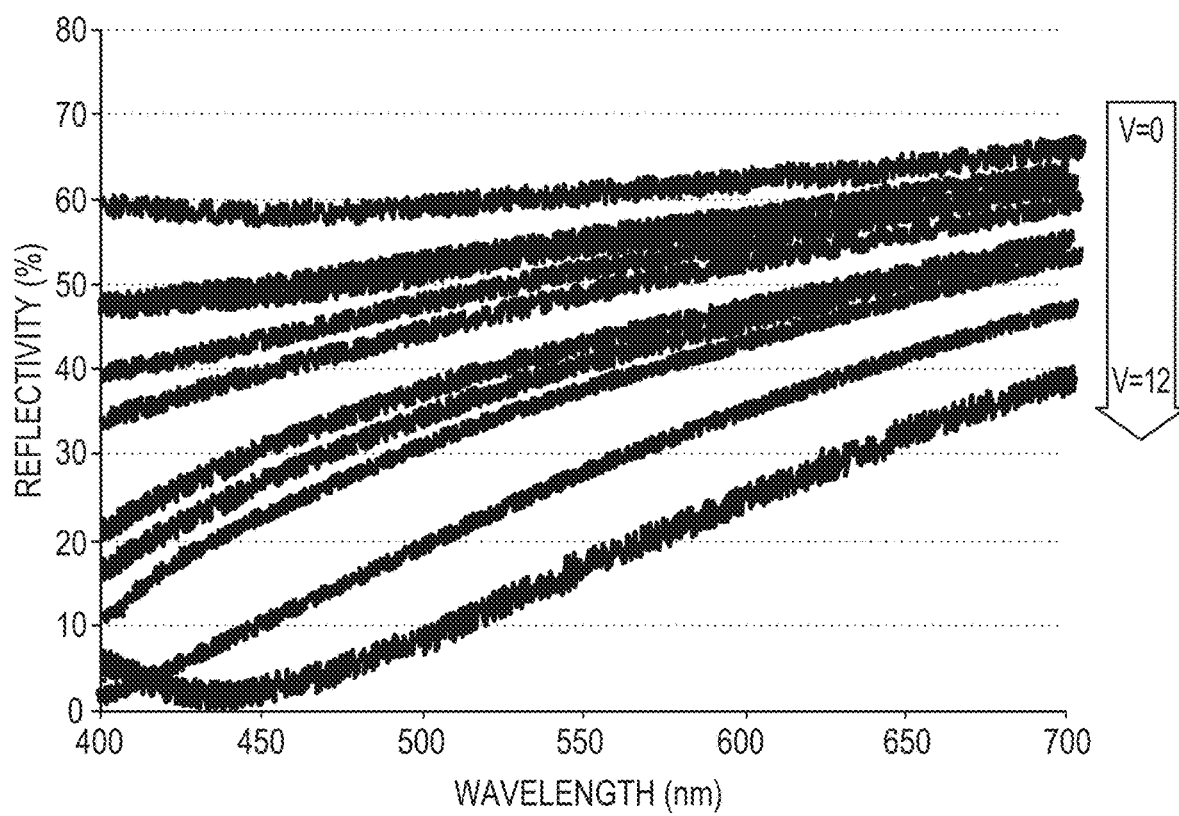
FIG. 17 is a graph of reflectivity of a layer, as a function of wavelength, as a function of applied anodization voltage in accordance with various embodiments of the invention.

FIG. 16 is a graph of reflectivity as a function of wavelength for a 250 nm-thick film of 50% Mo and 50% Ti on a silicon substrate before anodization (reflectivity 1600) and after anodization (reflectivity 1610) at an applied voltage of 12 in a solution of TSP and water having a pH of approximately 11. As shown, the formation of the overlying dielectric layer (which has a thickness of approximately 1.5 nm) reduces the reflectivity of the layer from 60%-68% to 8%-40%. FIG. 17 is a graph depicting the reflectivity of the anodized film as a function of applied voltage, from 0V (i.e., not anodized) to 12V, demonstrating that higher voltage (and thus a thicker anodized dielectric layer) results in lower reflectivity. Moreover, the thickness of the anodized dielectric layer, as well as the reflectivity thereof, may be selected via adjustment of the anodization voltage.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. A thin-film transistor comprising:
a substrate; and
an electrode comprising:
(a) disposed over the substrate, a conductor layer comprising at least one of Cu, Ag, Al, or Au, and
(b) disposed over the conductor layer, a bilayer capping layer comprising a base layer and a dielectric layer disposed thereover, wherein (i) the base layer comprises an alloy of Cu and/or Mo with 0.5 weight %-50 weight % of one or more anodizable alloying elements selected from the list consisting of Ta, Nb, Al, Hf, Zr, Ti, and Mg, and (ii) the dielectric layer comprises an oxide, nitride, or oxynitride of the one or more anodizable alloying elements.

2. The thin-film transistor of claim 1, wherein the substrate comprises glass or silicon.

3. The thin-film transistor of claim 2, wherein the substrate comprises amorphous silicon.

4. The thin-film transistor of claim 1, wherein the base layer comprises an alloy of (i) Mo and Nb, (ii) Mo, Ta, and Nb, (iii) Mo, Nb, and Ti, (iv) Mo and Ti, or (v) Mo, Nb, and Zr.

5. The thin-film transistor of claim 1, wherein the base layer comprises an alloy of Cu, Ta, and Zr.

6. The thin-film transistor of claim 1, wherein the dielectric layer is substantially free of Cu and/or Mo.

7. The thin-film transistor of claim 1, wherein the base layer comprises:
an interfacial portion disposed beneath and in contact with the dielectric layer; and
a bottom portion disposed beneath the interfacial portion.

8. The thin-film transistor of claim 7, wherein a concentration of at least one of the one or more anodizable alloying elements within the interfacial portion is less than a concentration of at least one of the one or more anodizable alloying elements within the bottom portion.

9. The thin-film transistor of claim 7, wherein the interfacial portion is substantially free of at least one of the one or more anodizable alloying elements.

10. The thin-film transistor of claim 7, wherein the interfacial portion is substantially free of all of said one or more anodizable alloying elements.

11. A thin-film transistor comprising:
a substrate; and
an electrode comprising:
(a) disposed over the substrate, a bilayer barrier layer comprising a base layer and a dielectric layer disposed thereover, wherein (i) the base layer comprises an alloy of Cu and/or Mo with 0.5 weight %-50 weight % of one or more anodizable alloying elements selected from the list consisting of Ta, Nb, Al, Hf, Zr, Ti, and Mg, and (ii) the dielectric layer comprises an oxide, nitride, or oxynitride of the one or more anodizable alloying elements, and
(b) disposed over the barrier layer, a conductor layer comprising at least one of Cu, Ag, Al, or Au.

12. The thin-film transistor of claim 11, wherein the substrate comprises glass or silicon.

13. The thin-film transistor of claim 12, wherein the substrate comprises amorphous silicon.

14. The thin-film transistor of claim 11, wherein the base layer comprises an alloy of (i) Mo and Nb, (ii) Mo, Ta, and Nb, (iii) Mo, Nb, and Ti, (iv) Mo and Ti, or (v) Mo, Nb, and Zr.

15. The thin-film transistor of claim 11, wherein the base layer comprises an alloy of Cu, Ta, and Zr.

16. The thin-film transistor of claim 11, wherein the dielectric layer is substantially free of Cu and/or Mo.

17. The thin-film transistor of claim 11, wherein the base layer comprises:
   an interfacial portion disposed beneath and in contact with the dielectric layer; and
   a bottom portion disposed beneath the interfacial portion.

18. The thin-film transistor of claim 17, wherein a concentration of at least one of the one or more anodizable alloying elements within the interfacial portion is less than a concentration of at least one of the one or more anodizable alloying elements within the bottom portion.

19. The thin-film transistor of claim 17, wherein the interfacial portion is substantially free of at least one of the one or more anodizable alloying elements.

20. The thin-film transistor of claim 17, wherein the interfacial portion is substantially free of all of said one or more anodizable alloying elements.

21. The thin-film transistor of claim 11, wherein the electrode comprises, disposed over the conductor layer, a bilayer capping layer comprising a second base layer and a second dielectric layer disposed thereover, wherein (i) the second base layer comprises an alloy of Cu and/or Mo with 0.5 weight %-50 weight % of one or more second anodizable alloying elements selected from the list consisting of Ta, Nb, Al, Hf, Zr, Ti, and Mg, and (ii) the second dielectric layer comprises an oxide, nitride, or oxynitride of the one or more second anodizable alloying elements.

22. The thin-film transistor of claim 21, wherein the base layer comprises an alloy the same as that of the second base layer.

23. The thin-film transistor of claim 21, wherein the base layer comprises an alloy different from that of the second base layer.

* * * * *